(12) United States Patent
Nagamine

(10) Patent No.: US 6,715,943 B2
(45) Date of Patent: Apr. 6, 2004

(54) SOLUTION TREATMENT METHOD AND SOLUTION TREATMENT UNIT

(75) Inventor: Shuichi Nagamine, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 169 days.

(21) Appl. No.: 09/999,893

(22) Filed: Oct. 31, 2001

(65) Prior Publication Data

US 2002/0053319 A1 May 9, 2002

(30) Foreign Application Priority Data

Nov. 7, 2000 (JP) ........................................ 2000-339163
Jan. 12, 2001 (JP) ........................................ 2001-004931

(51) Int. Cl.[7] .............................. G03D 5/00; G03D 5/04
(52) U.S. Cl. ...................... 396/611; 396/627; 396/638; 118/52
(58) Field of Search ................................. 396/611, 626, 396/627, 638; 355/30; 118/52, 240, 602

(56) References Cited

U.S. PATENT DOCUMENTS

| 5,876,280 A | * | 3/1999 | Kitano et al. ............... 454/187 |
| 5,944,894 A | | 8/1999 | Kitano et al. |
| 6,063,439 A | | 5/2000 | Semba et al. |
| 6,203,218 B1 | * | 3/2001 | Omori et al. ............... 396/611 |
| 6,293,713 B1 | * | 9/2001 | Ueda ........................... 396/611 |
| 6,401,401 B1 | * | 6/2002 | Williams ....................... 52/58 |

FOREIGN PATENT DOCUMENTS

GB 2217107 A * 10/1989

* cited by examiner

*Primary Examiner*—Alan Mathews
(74) *Attorney, Agent, or Firm*—Rader, Fishman & Grauer PLLC

(57) ABSTRACT

The present invention is a solution treatment unit for supplying a treatment solution to a substrate and treating the substrate inside an accommodating vessel, comprising a frame for having the accommodating vessel mounted therein. The accommodating vessel has a structure which enables it to be pulled out in a predetermined direction from the frame. Therefore, the accommodating vessel can be pulled out from the frame at the time of maintenance, which makes it possible to secure sufficient work space for performing the maintenance and to appropriately perform the maintenance operation.

26 Claims, 26 Drawing Sheets

SOLUTION TREATMENT METHOD AND SOLUTION TREATMENT UNIT

BACKGROUND OF THE INVENTION

1. Field of the Invention

The present invention relates to a solution treatment method and a solution treatment unit for a substrate.

2. Description of the Related Art

In a photolithography process, for example, in semiconductor device fabrication processes, resist coating treatment for forming a resist film on a surface of a wafer, exposure processing for irradiating and exposing the wafer in a pattern, developing treatment for developing the wafer after the exposure processing, heat treatment and cooling treatment, which are performed before the coating treatment, before and after the exposure processing and after the developing treatment, and so on are performed, and this series of processing is performed in each processing unit provided in a coating and developing treatment system.

In recent years, due to a demand for improved processing capability of the coating and developing treatment system, the need for increasing the number of the resist coating units for performing the resist coating treatment and the developing units for performing the developing treatment as described above disposed in one coating and developing treatment system has been increasing in order to process more of the wafers synchronously.

However, disposing many of the resist coating units and so on requires the coating and developing treatment system to be enlarged and a floor area occupied by the system to be increased. Therefore, it can be proposed that thickness of the resist coating unit and the developing unit is reduced and the developing units and so on are disposed in three tiers or more, which is in more tiers than in a conventional art, in order to prevent the increase in the occupied floor area.

However, disposing these units in multi-tiers in the coating and developing treatment system whose height is limited causes space between the units to be narrow so that maintenance of the units cannot be performed. Even when the maintenance can be performed, the work for the maintenance becomes very difficult. The resist coating unit and the developing unit in particular, which use a treatment solution such as a developing solution, are easy to be contaminated inside the units and need frequent maintenance such as washing, and this is a big disadvantage in disposing the developing units and so on in multi-tiers.

The above developing treatment is usually performed in the developing unit. The developing unit includes a casing, a spin chuck for holding and rotating the wafer placed in the casing, a cup for receiving the developing solution and the like scattered from the wafer due to the rotation of the wafer, and an outside cup disposed outside the cup.

The developing solution is supplied onto the wafer which is delivered into the casing and held on the spin chuck, and thereafter, the wafer is developed for a predetermined period of time in a static state. After the predetermined period of time passes, the wafer is rotated and the wafer is washed and dried.

Furthermore, a supply unit for supplying air into the casing during the developing treatment is provided in an upper part of the casing and an exhaust unit for exhausting an atmosphere inside the outside cup including an atmosphere inside the cup is provided in a lower part of the outside cup.

The air supplied into the casing is normally exhausted from the lower part of the outside cup to form a descendent air current inside the cup, and thereby impurities occurring from the wafer and so on are purged. When the wafer is developed in the static state, however, temperature distribution needs to be maintained uniform over the surface of the wafer, and therefore, the exhausting of the air from the lower part of the outside cup is temporarily interrupted in order to suppress to a minimum the air current on the wafer surface which affects temperature of the wafer.

When the exhausting of the air is thus temporarily interrupted, however, the impurities occurring from the wafer and so on are not appropriately exhausted to float inside the casing and may possibly adhere to the wafer again. When the impurities adhere to the wafer in this way, a flaw in the development is caused with the adhered part left undeveloped. Furthermore, due to the interruption of the exhausting, a flow path of the air supplied into the casing is changed to produce a convection and the like so that uniform temperature distribution over the surface of the wafer is not always obtained. The non-uniform temperature distribution over the surface of the wafer causes difference in developing progresses so that a line width of a circuit pattern to be finally formed may not possibly be made uniform.

SUMMARY OF THE INVENTION

The present invention is made in consideration of the above-described aspects and it is a first object of the present invention to appropriately perform maintenance even when solution treatment units such as resist coating units and developing units are disposed in multi-tiers.

Furthermore, it is a second object of the present invention to maintain uniform temperature distribution over a surface of a substrate such as a wafer while preventing impurities from adhering to the substrate again.

In order to achieve the first object, according to one of the aspects of the present invention, the present invention is a solution treatment unit for supplying a treatment solution to a substrate and treating the substrate inside an accommodating vessel, comprising a frame for having the accommodating vessel mounted therein and in which the accommodating vessel is structured to be pulled out freely in a predetermined direction from the frame.

Since the accommodating vessel can be pulled out freely, sufficient work space for performing the maintenance can be secured when the accommodating vessel is pulled out from the frame at the time of the maintenance. Therefore, the maintenance operation can be appropriately performed.

The structure of the frame being pulled out freely is realized, for example, by the structure in which a rail is provided in the frame along the predetermined direction and, for example, the accommodating vessel is movable on the rail.

In order to achieve the second object, according to another aspect of the present invention, the present invention is a solution treatment method for supplying a treatment solution to a substrate and performing solution treatment for the substrate inside a vessel disposed inside a casing, comprising the steps of: supplying gas from an upper part of the vessel inside the casing; adjusting a first flow rate of the supplied gas flowing into the vessel and a second flow rate of the supplied gas flowing out of the vessel; and exhausting the gas flowing into the vessel and the gas flowing out of the vessel outside the casing.

In order to achieve the second object, according to still another aspect of the present invention, the present invention is a solution treatment unit for performing solution treatment for a substrate inside a casing, comprising a vessel provided in the casing to enclose an outer circumference of the substrate; a gas supply section for supplying gas into the casing; an exhaust section for collectively exhausting an atmosphere flowing into the vessel and an atmosphere flowing out of the vessel outside the casing; and an adjusting unit for adjusting a flow rate of gas flowing into the vessel and a flow rate of gas flowing out of the vessel.

According to the present invention, the first flow rate of the gas flowing into the vessel from the upper part and the second flow rate of the gas flowing out of the vessel can be adjusted so that the first flow rate can be increased to strengthen an air current on the periphery of the substrate, for example, when impurities such as a developing solution are likely to occur from the substrate and so on. This makes it possible to appropriately discharge the impurities occurring from the substrate out of the vessel and prevent the impurities from adhering to the substrate again. Furthermore, in order to maintain uniform temperature distribution over a surface of the substrate, the second flow rate is increased to cause the gas from the upper part to flow out of the vessel so that the flow on the surface of the substrate can be weakened. Consequently, non-uniform temperature fall on the surface of the substrate due to the air current is prevented so that the temperature distribution is maintained uniform over the surface of the substrate.

DETAILED DESCRIPTION OF THE PREFERRED EMBODIMENTS

Figure 1:
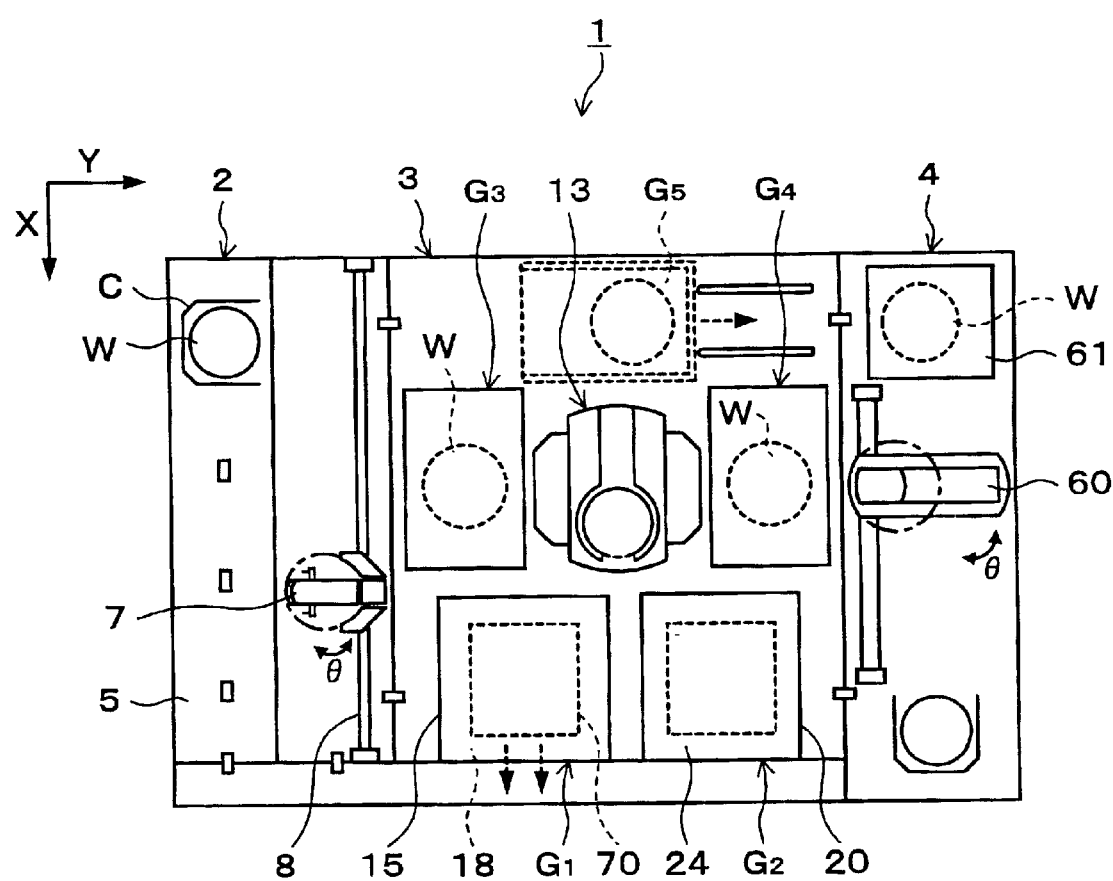
FIG. 1 is a plan view showing a schematic structure of a coating and developing treatment system including a developing unit according to an embodiment of the present invention.
Figure 2:
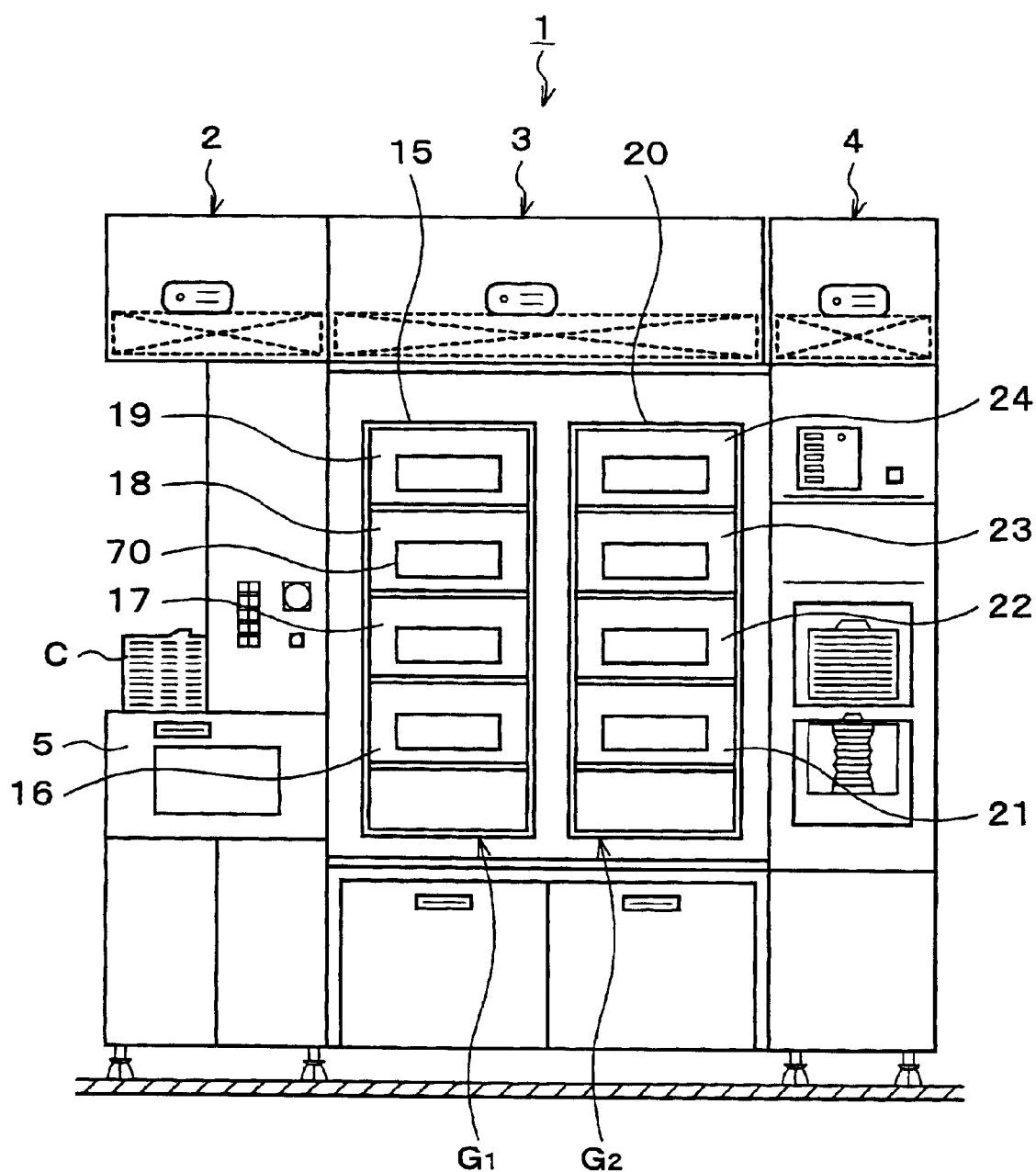
FIG. 2 is a front view of the coating and developing treatment system in FIG. 1.
Figure 3:
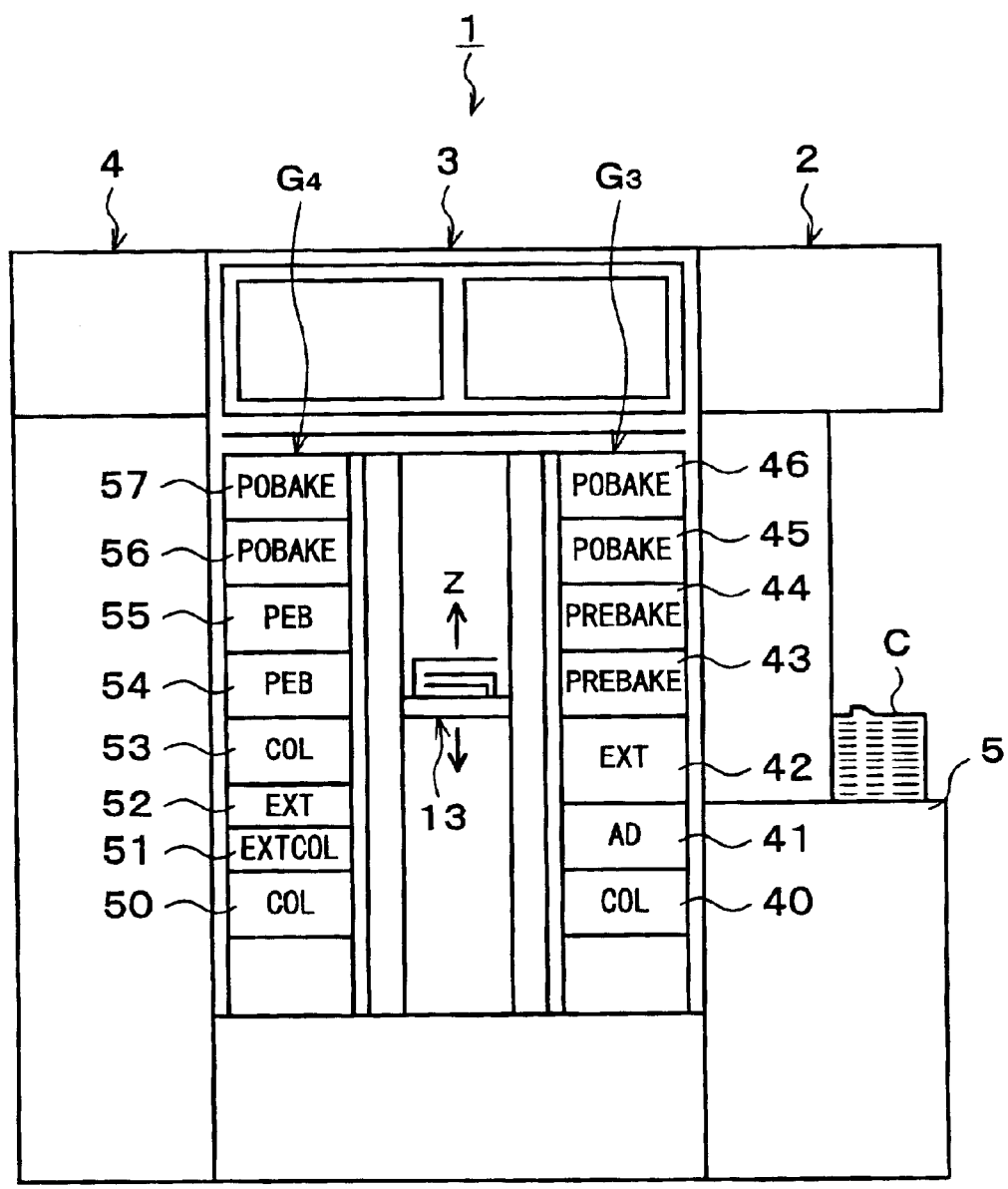
FIG. 3 is a rear view of the coating and developing treatment system in FIG. 1.

Preferred embodiments of the present invention will be described below. FIG. 1 is a plan view showing a schematic structure of a coating and developing treatment system 1 including a developing unit according to the present invention, FIG. 2 is a front view of the coating and developing treatment system 1, and FIG. 3 is a rear view of the coating and developing treatment system 1.

As shown in FIG. 1, the coating and developing treatment system 1 has a structure in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering the wafers W to/from a not-shown aligner which is disposed adjacent to the processing station 3 are integrally connected.

In the cassette station 2, a plurality of the cassettes C are mountable in predetermined positions on a cassette mounting table 5, which serves as a mounting portion, in a line in the X-direction (the vertical direction in FIG. 1). Furthermore, a wafer carrier 7, which is movable in the alignment direction of the cassettes (the X-direction) and in an alignment direction of the wafers W housed in the cassette C (the Z-direction; the perpendicular direction), is provided to be movable along a carrier path 8 so that it is selectively accessible to each of the cassettes C.

The wafer carrier 7 has an alignment function for aligning the wafers W. The wafer carrier 7 is structured so as to be also accessible to an extension unit 42 included in a third processing unit group G3 on a processing station 3 side as will be described later.

In the processing station 3, a main carrier 13 is provided in a center part thereof, and various kinds of the processing units are multi-tiered on a periphery of the main carrier 13 to constitute processing unit groups. In the coating and developing treatment system 1, where four processing unit groups G1, G2, G3 and G4 are provided, the first and the second processing unit groups G1 and G2 are disposed on a front side of the coating and developing treatment system 1, the third processing unit group G3 is disposed adjacent to the cassette station 2, and the fourth processing unit group G4 is disposed adjacent to the interface section 4. Furthermore, a fifth processing unit group G5 depicted by the broken line is allowed to be additionally disposed on a rear side as an option. The main carrier 13 is capable of carrying the wafers W to/from various kinds of later described processing units which are disposed in these processing unit groups G1, G2, G3, and G4. Incidentally, the number and the arrangement of the processing unit groups vary depending on which kind of processing is performed on the wafers W and the number of the processing unit groups may be selectively changed.

In the first processing unit group G1, a frame 15 having a substantially rectangular parallelepiped frame shape which is long in a vertical direction and being divided to have a plurality of 'rooms with no wall' which are disposed in the vertical direction is provided as shown in FIG. 2. The frame 15 is structured to allow a plurality of processing units to be disposed in multi-tiers therein. In the frame 15, resist coating units 16 and 17 for supplying a resist solution onto the wafer W to form a resist film on the wafer and developing units 18 and 19, which work as solution treatment units, according to this embodiment are disposed in four tiers in order from the bottom. Similarly, in the processing unit group G2, resist coating units 21 and 22 and developing units 23 and 24 are disposed in four tiers in order from the bottom in a frame 20.

Figure 4:
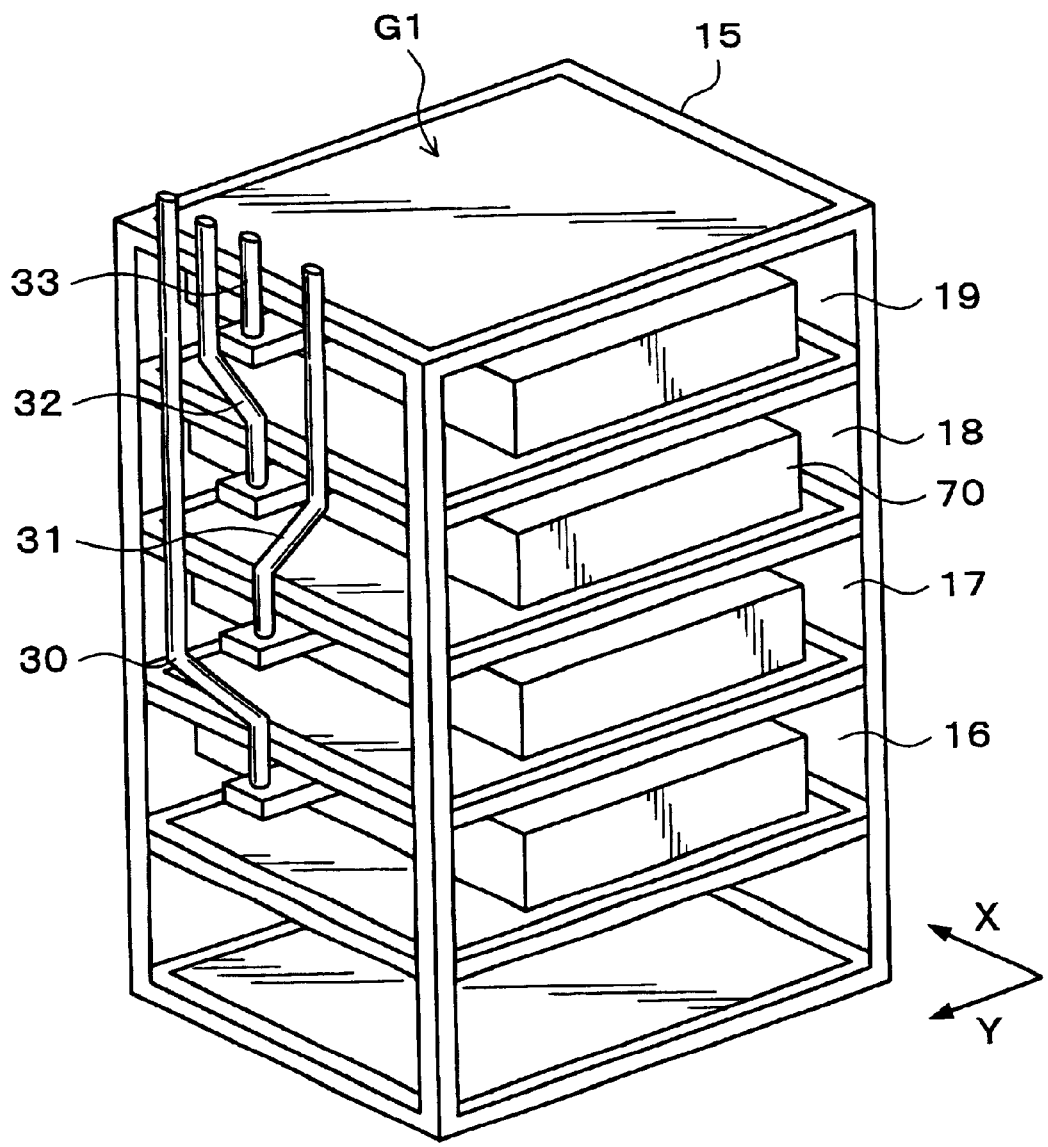
FIG. 4 is a perspective view showing a layout example of a supply duct attached to a frame.

On a side surface on the positive direction side of the Y-direction (the right direction in FIG. 1) of the frame 15, supply ducts 30, 31, 32, and 33 for supplying each of the processing units in the processing unit group G1, namely, the resist coating units 16 and 17 and the developing units 18 and 19, with air whose temperature and humidity are adjusted to predetermined values are concentratedly provided, as shown in FIG. 4. Each of the supply ducts 30 to 33 is connected to each of later-described air supply sections of each of the processing units and is disposed along the side surface of the frame 15 to extend upward from each of the air supply sections so that it is structured to be capable of supplying air from a not-shown air supply source above into each of the processing units. Incidentally, a duct system in which supply ducts branch off from one duct may also be used.

Figure 5:
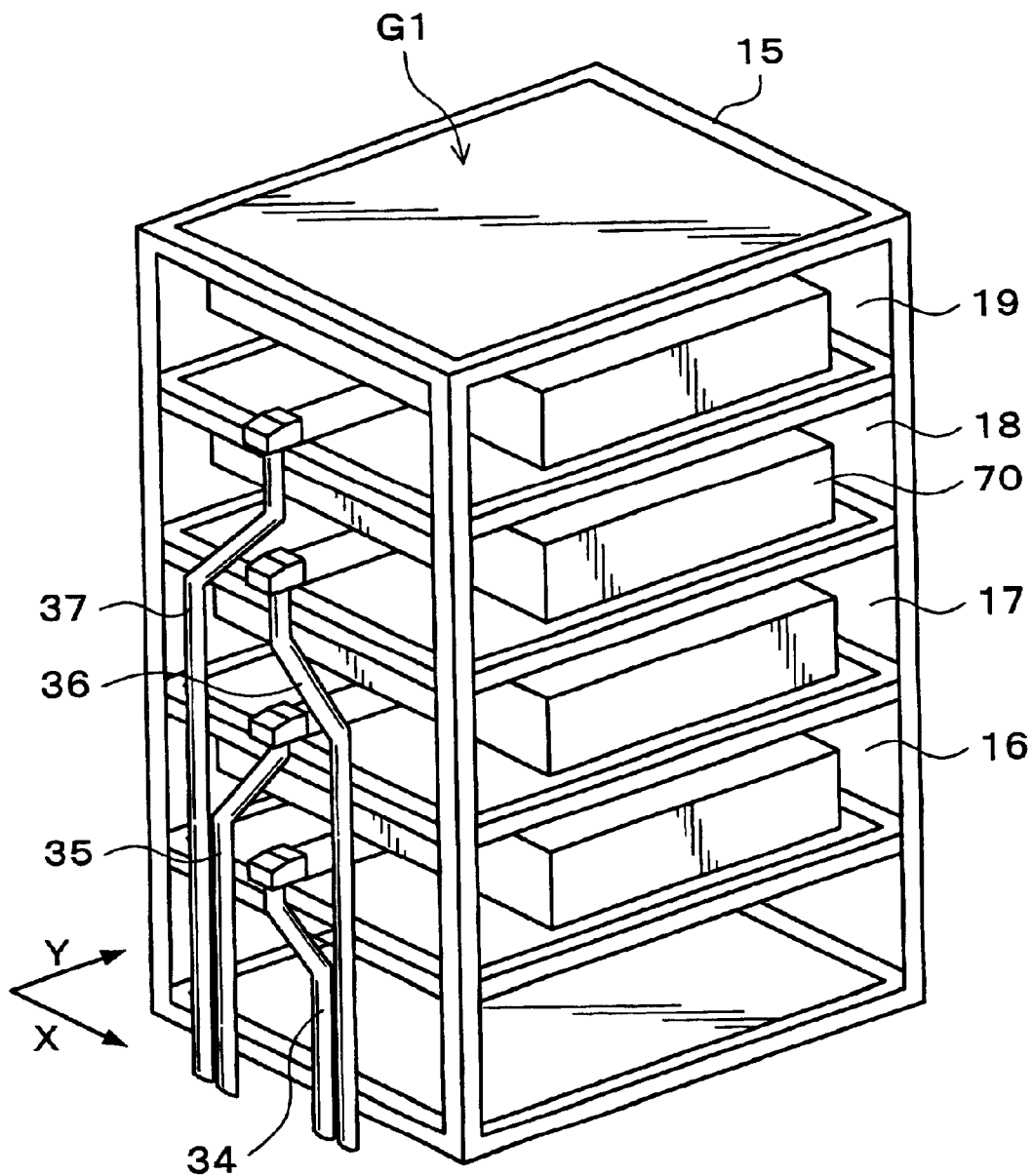
FIG. 5 is a perspective view showing a layout example of an exhaust duct attached to the frame.

On a side surface on the negative direction side of the Y-direction (the left direction in FIG. 1) of the frame 15, exhaust ducts 34, 35, 36, and 37 for exhausting atmospheres inside the processing units in the processing unit group G1, namely, the resist coating units 16 and 17 and the developing units 18 and 19 are concentratedly provided, as shown in FIG. 5. Each of the exhaust ducts 34 to 37 is connected to each of later-described exhaust pipes of each of the processing units respectively and is disposed along the side surface of the frame 15 to extend toward a lower part of the frame 15 from each of the exhaust pipes so that the atmosphere from each of the processing units can be exhausted outside the coating and developing treatment system 1 from the frame 15.

In the third processing unit group G3, for example, as shown in FIG. 3, a cooling unit 40 for cooling the wafers W, an adhesion unit 41 for increasing fixability between the resist solution and the wafers W, the extension unit 42 for keeping the wafers W on stand-by therein, pre-baking units 43 and 44 for drying a solvent in the resist solution, post-baking units 45 and 46 for performing heat treatment after developing treatment, and so on are, for example, seven-tiered in the order from the bottom.

In the fourth processing unit group G4, for example, a cooling unit 50, an extension and cooling unit 51 for spontaneously cooling the mounted wafers W, an extension unit 52, a cooling unit 53, post-exposure baking units 54 and 55 for performing heat treatment after exposure processing, post-baking units 56 and 57, and so on are, for example, eight-tiered in the order from the bottom.

In a center part of the interface section 4, a wafer carrier 60 is provided. The wafer carrier 60 is structured so as to be movable in the X-direction (the vertical direction in FIG. 1) and the Z-direction (the perpendicular direction), and to be rotatable in the θ direction (a rotational direction about an axis Z), so that it is structured to be accessible to the extension and cooling unit 51 and the extension unit 52 which are included in the fourth processing unit group G4, a peripheral aligner 61, and the not-shown aligner to carry the wafers W to each of them.

Figure 6:
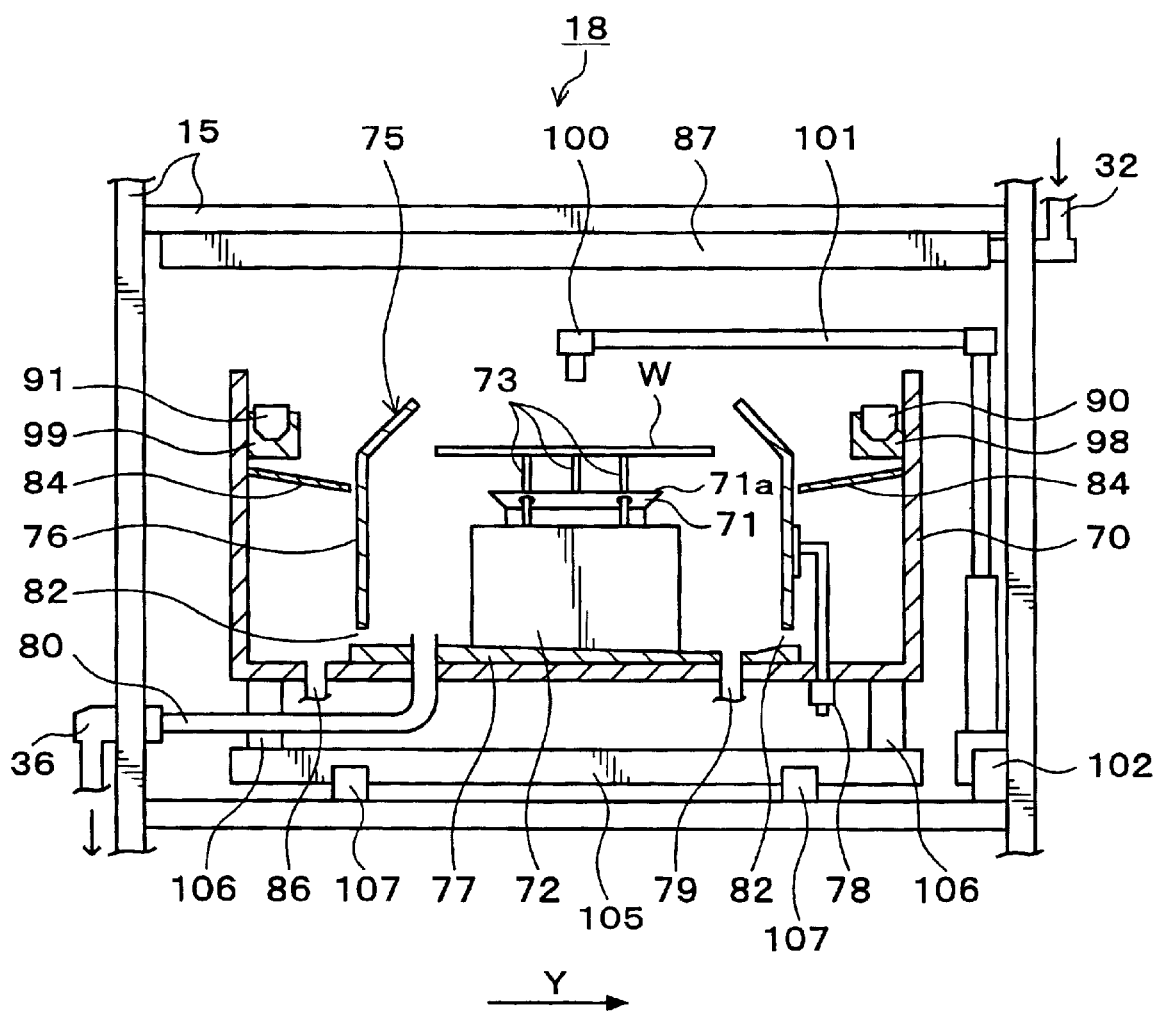
FIG. 6 is an explanatory view of a vertical cross section of the developing unit according to this embodiment.

Next, the structure of the developing unit 18 described above will be explained in detail. FIG. 6 is an explanatory view of a vertical cross section showing a schematic structure of the developing unit 18 and FIG. 7 is an explanatory view of a horizontal cross section of the developing unit 18.

Figure 7:
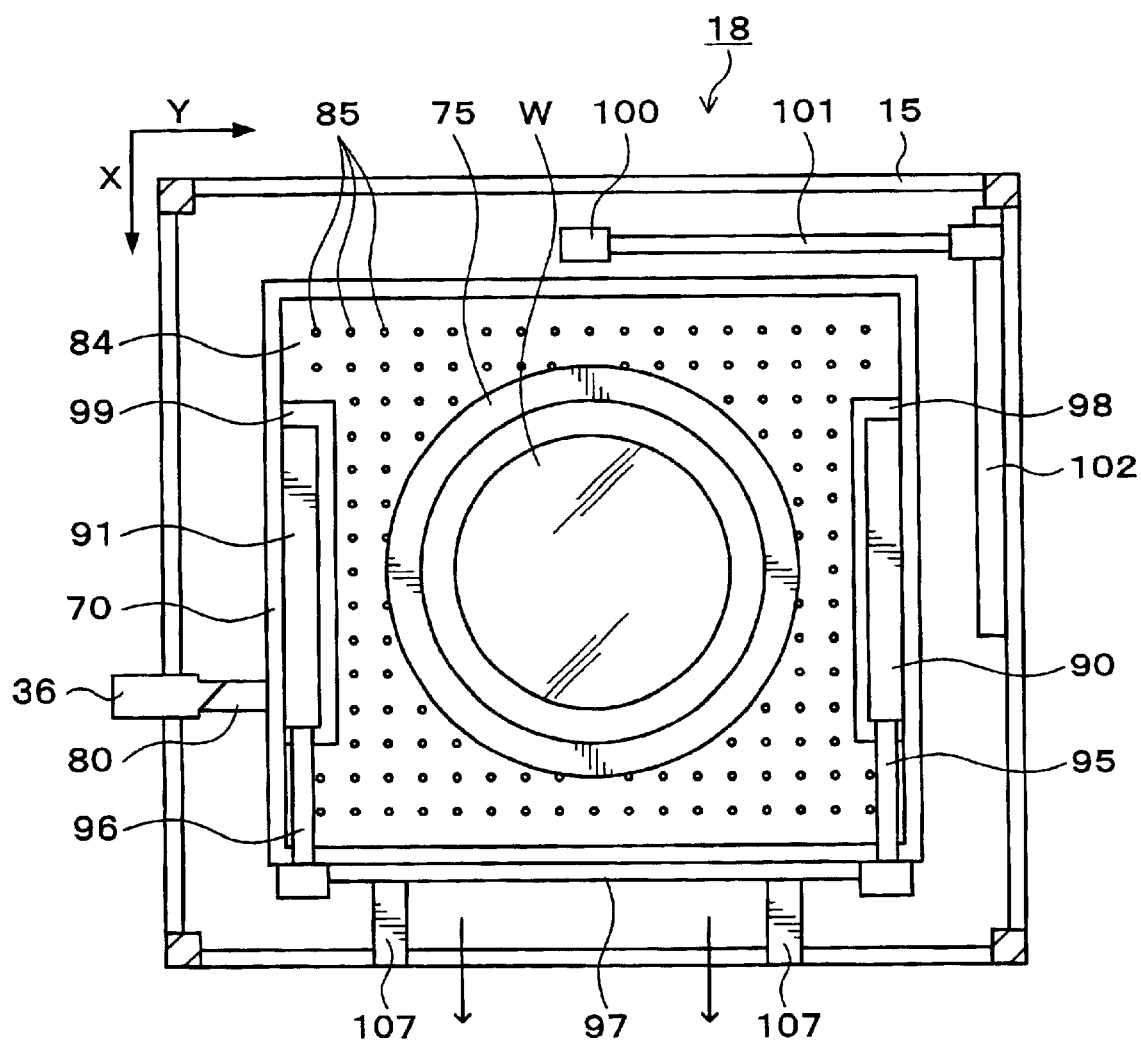
FIG. 7 is an explanatory view of a horizontal cross section of the developing unit in FIG. 6.

The developing unit 18 has inside the frame 15 a box-shaped cup accommodating section 70, which works as an accommodating vessel, with an upper part thereof being open as shown in FIG. 6 and FIG. 7. In a center part of the cup accommodating section 70, a spin chuck 71 with an upper surface portion 71a formed to be horizontal and circular-shaped is provided. The wafer W is horizontally mountable on the spin chuck 71. The spin chuck 71 is provided with a not-shown suction port, for example, on the upper surface portion 71a thereof to hold the wafer W by suction.

Under the spin chuck 71, a drive mechanism 72 for driving the spin chuck 71 and so on is provided. The drive mechanism 72 has a not-shown rotation drive section provided with a motor or the like, for rotating the spin chuck 71 and has a not-shown hoisting and lowering drive section provided with a cylinder or the like, for hoisting and lowering later-described hoisting and lowering pins 73. The rotation drive section of the drive mechanism 72 enables the wafer W which is held on the spin chuck 71 to rotate at a predetermined rotational speed.

On a peripheral part of the upper surface portion 71a of the spin chuck 71, a plurality of the hoisting and lowering pins 73 for supporting and hoisting/lowering the wafer W are provided. The hoisting and lowering pins 73 are so structured that it can be hoisted and lowered to a predetermined height by the drive mechanism 72 as described above, and their movement in a vertical direction in not-shown through holes which are formed in the upper surface portion 71a of the spin chuck 71 enables the wafer W to be placed in a predetermined position above the spin chuck 71 and to be mounted on the spin chuck 71.

Outside an outer circumference of the spin chuck 71, a substantially cylindrical-shaped cup 75, which works as a processing vessel, with an upper part thereof being open is provided to enclose the spin chuck 71 so that the developing solution and so on which scatter when the wafer W is rotated are received therein and the contamination of the developing unit 18 can be prevented. The cup 75 has a cup side portion 76 for mainly receiving the scattered developing solution and so on and a cup bottom portion 77 for collecting the received developing solution and so on.

To the cup side portion 76, a hoisting and lowering mechanism 78 for enabling only the cup side portion 76 to vertically move is attached to hoist and lower the cup side portion 76 when necessary.

The cup bottom portion 77 is disposed in a slanting manner and to a lower part thereof, a drain pipe 79 for discharging the developing solution and so on which are collected in the cup side portion 76 is attached. To the cup bottom portion 77, an exhaust pipe 80 extending from the inside of the cup 75 to a side part on the negative direction side of the Y-direction (the right direction in FIG. 6) of the frame 15 is attached. The exhaust pipe 80 is connected to the aforesaid exhaust duct 36 and is structured to be able to exhaust an atmosphere inside the cup accommodating section 70 out of the coating and developing treatment system 1 via the exhaust duct 36.

Figure 8:
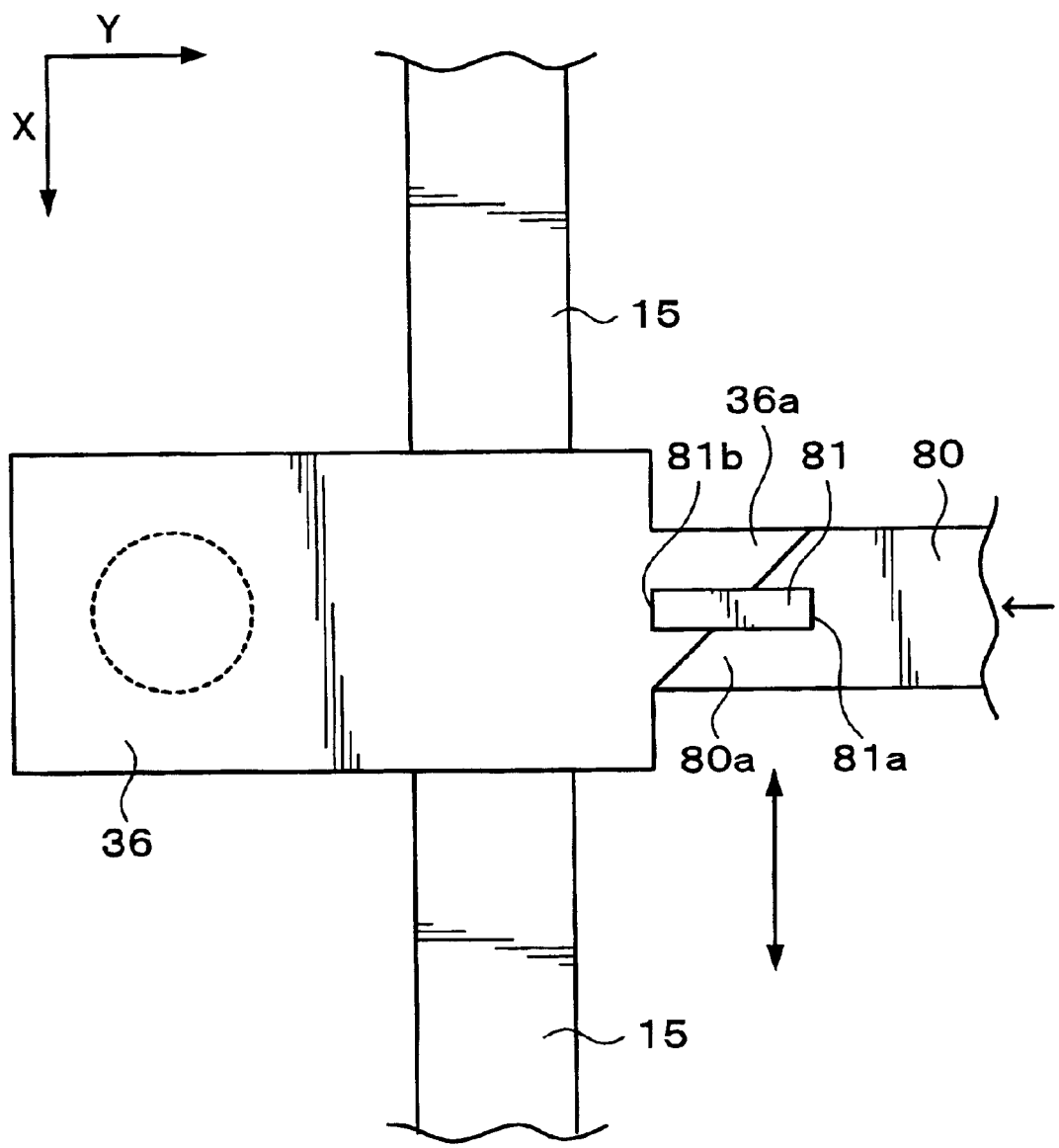
FIG. 8 is an explanatory plan view of a connecting part of an exhaust pipe and an exhaust duct.

The connected state between the exhaust duct 36 and the exhaust pipe 80 can be maintained, for example, by a fastening member 80 as shown in FIG. 8.

The fastening member 81 is provided, for example, with one end 81a thereof fixed to a connecting end portion 80a of the exhaust pipe 80, while the other end 81b of the fastening member 81 can be fixed to and detached from the connecting end portion 36a of the exhaust duct 36 freely. Thereby, having the other end 81b of the fastening member 81 caught by the connecting end portion 36a when the exhaust duct 36 and the exhaust pipe 80 is in the connected state makes it possible to maintain the connected state between the connecting end portion 36a of the exhaust duct 36 and the connecting end portion 80a of the exhaust pipe 80.

The connecting end portion 80a of the exhaust pipe 80 is formed to be slanted, for example, with a part on the positive direction side of the X-direction (the downward side in FIG. 8), which is a predetermined direction, of the connecting end portion 80a protruding toward the exhaust duct 36, when seen from a plane surface thereof, while the connecting end portion 36a of the exhaust duct 36 is formed to be slanted to conform to the shape of the connecting end portion 80a of the exhaust pipe 80 with a part on the negative direction side of the X-direction of the connecting end portion 36a protruding toward the exhaust pipe 80. Consequently, the movement of the cup accommodating section 70 in the positive direction of the X-direction, which is its pulled-out direction, makes it possible to detach the exhaust pipe 80 from the exhaust duct 36 while the movement of the cup accommodating section 70 in the negative direction of the X-direction, which is its pushed-in direction, makes it possible to connect the exhaust pipe 80 to the exhaust duct 36.

An opening 82 is provided between a lower end part of the cup side portion 76 and the cup bottom portion 77 as shown in FIG. 6, so that gas, which temporarily flows out of the cup 75 from an upper part thereof, can be taken into the cup 75 from the opening 82 and can be exhausted from the exhaust pipe 80. The width of the opening 82 is adjustable by the vertical movement of the cup side portion 76 mentioned above so that a flow rate of the gas flowing through the opening 82 is adjustable by changing the width of the opening 82 as required.

Outside an outer circumference of the cup 75, a collecting plate 84 for covering space between the cup 75 and the cup accommodating section 70 is provided to collect the developing solution and so on leaking out of the cup 75. The collecting plate 84 is formed to be slanted with its cup 75 side part being lower. In the collecting plate 84, a number of ventilation holes 85 are formed as shown in FIG. 7 so that the gas from the upper part flowing out of the cup 75 passes through the ventilation holes 85 to flow into the opening 82.

A drain pipe 86 for discharging the above-mentioned developing solution and so on leaking out of the cup 75 is provided in a bottom part of the cup accommodating section 70 between the outer circumference of the cup 75 and an inner circumference of the cup accommodating section 70.

An air supply unit 87, which works as a gas supply section, for supplying the gas, for example, air into the cup accommodating section 70 is attached to the frame 15 above the cup accommodating section 70. The air supply unit 87 is connected to the aforesaid supply duct 32. The air supply unit 87 has a function of removing impurities included in the air from the supply duct 32 and a function of uniformly supplying the air to all over the cup accommodating section 70 so that the air from the supply duct 32 can be purified and a uniform descending air current can be formed all over the cup accommodating section 70 and thereby, the inside of the cup accommodating section 70 can be purged.

Developing solution supply nozzles 90 and 91, which work as developing solution supply nozzles, for supplying the developing solution onto the wafer W are disposed on side walls on the positive direction side of the Y-direction, which is a first direction, of the cup accommodating section 70 and on the negative direction side of the Y-direction, as shown in FIG. 6 and FIG. 7. Each of the developing solution supply nozzles 90 and 91 is structured to be capable of supplying the developing solution different from each other and either the developing solution supply nozzle 90 or 91 appropriate for a recipe for the developing treatment is used when the developing treatment is performed. Each of the developing solution supply nozzles 90 and 91 is formed to be in a long and slender shape with its length being longer at least than the diameter of the wafer W.

Figure 9:
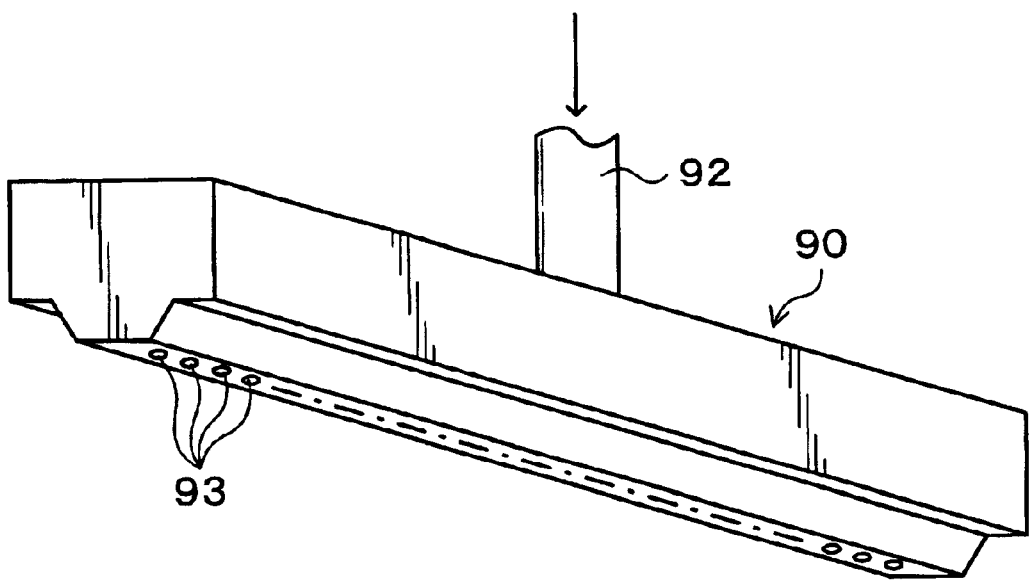
FIG. 9 is a perspective view of a developing solution supply nozzle used in the developing unit.

One end of a pipe 92 for flowing the developing solution into the developing solution supply nozzle 90 from a not-shown developing solution supply source therethrough is connected to an upper surface of the developing solution supply nozzle 90 as shown in FIG. 9. On a lower surface of the developing solution supply nozzle 90, a plurality of developing solution discharge ports 93 are disposed in a line in a longitudinal direction. Thereby, the same amount of the developing solution flowing in from the pipe 92 is discharged simultaneously from each of the developing solution discharge ports 93 of the developing solution supply nozzle 90. The developing solution supply nozzle 91 also has completely the same structure as that of the developing solution supply nozzle 90.

The developing solution supply nozzles 90 and 91 are supported by arms 95 and 96 with their longitudinal directions being the X-direction as shown in FIG. 7. The arms 95 and 96 are provided to be movable on a rail 97 which extends in the Y-direction by a not-shown drive control mechanism. The rail 97 is attached on an outer surface on the positive direction side of the X-direction of the cup accommodating section 70 to extend from an end part on the positive direction side of the Y-direction to an end part on the negative direction side of the Y-direction of the outer surface of the cup accommodating section 70. The speed and timing of the movement when the arms 95 and 96 are moved are controlled by the not-shown drive control mechanism. This enables the developing solution supply nozzles 90 and 91 which are supported by the arms 95 and 96 respectively to move from one end to another end of the wafer W at a predetermined speed while discharging a predetermined flow rate of the developing solution to supply the developing solution all over the surface of the wafer W so that a solution film of the developing solution with a predetermined thickness can be formed on the wafer W. A not-shown moving mechanism for vertically moving the arms 95 and 96 is provided in the arm 95 and 96, and thereby, distance between the developing solution supply nozzles 90, 91 and the wafer W and the like are adjustable.

Washing tanks 98 and 99 for washing the developing solution supply nozzles 90 and 91 are provided on both of side walls on the Y-direction side of the cup accommodating section 70 so that the developing solution supply nozzles 90 and 91 are allowed to be kept on stand-by in the washing tanks 98 and 99 except when the developing solution is supplied. The washing tanks 98 and 99 have recessed-shaped cross sections for receiving the long and slender developing solution supply nozzles 90 and 91 therein, and a washing fluid for washing off the developing solution adhering to the developing solution supply nozzles 90 and 91, for example, pure water is stored inside the washing tanks 98 and 99.

Meanwhile, outside the cup accommodating section 70 on the negative direction side of the X-direction, namely, outside of the cup accommodating section 70 on a perpendicular direction side to the moving direction of the developing solution supply nozzles 90 and 91, a washing fluid supply nozzle 100 for supplying the washing fluid to the wafer W is provided. The washing fluid supply nozzle 100 is supported by an arm 101, and the arm 101 is movable on a rail 102 extending in the X-direction. The rail 102 extends, for example, from the negative direction side of the X-direction of the cup accommodating section 70 to a position across a center part of the spin chuck 71 and is fixed to the frame 15. A not-shown drive mechanism is provided in the arm 101 to cause the arm 101 to be movable on the rail 102. This enables the washing fluid supply nozzle 100 to move to the center part of the wafer W from the aforesaid outside of the cup accommodating section 70 when necessary to supply the washing fluid onto the center of the wafer W. A not-shown moving mechanism for vertically moving the arm 101 is provided in the arm 101 so that distance between the wafer W and the washing fluid supply nozzle 100 and so on are adjustable as required.

Figure 10:
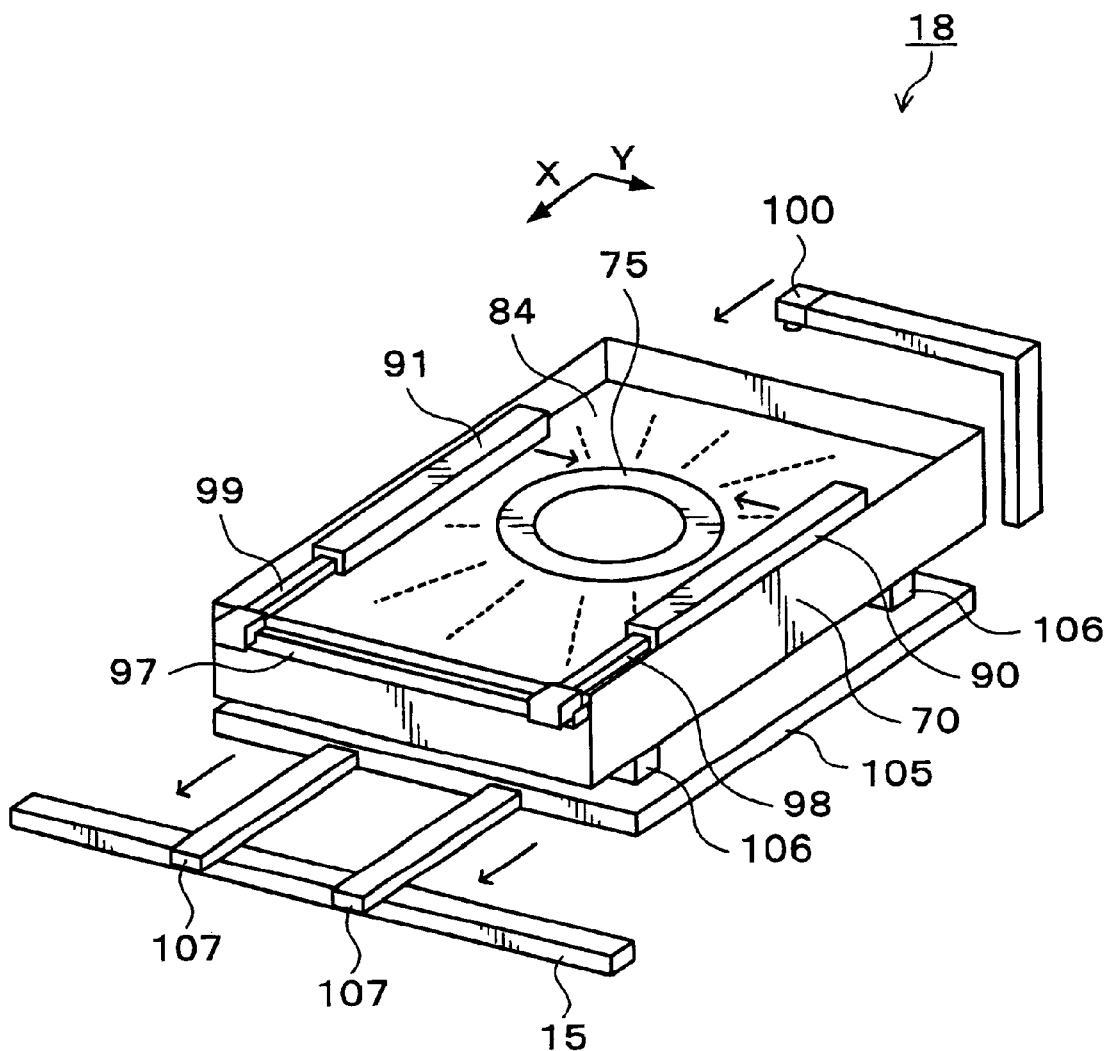
FIG. 10 is a perspective view showing a schematic structure of the developing unit.

Under the cup accommodating section 70, a base 105 having some thickness in a substantially square shape when seen from its plane surface is provided as shown in FIG. 10. A plurality of supporting members 106 for supporting the cup accommodating section 70 from the bottom are provided on the base 105. The supporting members 106 are provided to be fixed to the cup accommodating section 70 and the base 105 so that the cup accommodating section 70 moves together with the base 105.

On a bottom surface of the base 105, two rails 107 extending in the X-direction are provided to be fixed to the frame 15, and the base 105 is structured to be movable on the rails 107. The rails 107 extend to a side part on the positive direction side of the X-direction of the frame 15, and when the base 105 is moved on the rails 107, the cup accommodating section 70 can be pulled out from the frame 15.

Next, the operation of the developing unit 18 as structured above is explained together with the steps of a photolithography process performed in the coating and developing treatment system 1.

First, the wafer carrier 7 takes out one unprocessed wafer W from the cassette C and carries it to the adhesion unit 41 which is included in the third processing unit group G3. The wafer W, which is coated with an adhesion promoter such as HMDS for improving fixability with the resist solution in the adhesion unit 41, is carried to the cooling unit 40 by the main carrier 13 and cooled to a predetermined temperature. Thereafter, the wafer W is carried to the resist coating unit 16, 17, 21, or 22 and the pre-baking unit 44 or 45 in sequence to undergo predetermined processing. The wafer W is then carried to the extension and cooling unit 51.

Then, the wafer W is taken out from the extension and cooling unit 51 by the wafer carrier 60 and thereafter, carried to the aligner (not shown) via the peripheral aligner 61. The wafer W after undergoing the exposure processing is carried to the extension unit 52 by the wafer carrier 60 and thereafter, held by the main carrier 13. Then, the wafer W is carried to the post-exposure baking unit 54 or 55 and the cooling unit 53 in sequence to undergo predetermined processing in each of the units, and thereafter, carried to the developing unit 18, 19, 23, or 24.

The wafer W after undergoing the developing treatment is again carried to the post-baking unit 45, 46, 56, or 57 and the cooling unit 40 in sequence by the main carrier 13 to undergo predetermined processing in each of the units. After that, the wafer W is returned to the cassette C by the wafer carrier 7 via the extension unit 42 and a series of predetermined coating and developing treatment is finished.

The operation of the above-described developing unit 18 will be explained in detail next. First, before the developing treatment is started, the air whose temperature and humidity are adjusted to the predetermined values starts to be supplied to the air supply unit 87 from the not-shown air supply source via the supply duct 32, and the air which is purified in the air supply unit 87 is supplied all over the cup accommodating section 70 to form the uniform descending air current inside the cup accommodating section 70. The atmosphere inside the cup accommodating section 70 is constantly exhausted at a fixed flow rate from the exhaust pipe 80 to purge the inside of the cup accommodating section 70. Incidentally, the atmosphere exhausted from the exhaust pipe 80 is exhausted outside the coating and developing treatment system 1 from the lower part of the frame 15 via the exhaust duct 36.

Then, when the developing treatment is started, the hoisting and lowering pins 73 are first hoisted to a position higher than an upper end part of the cup 75 so that the wafer W delivered into the frame 15 by the main carrier 13 is held on the hoisting and lowering pins 73. Next, the cup side portion 76 is lowered to cause the position of the upper end part of the cup 75 to be lower and the hoisting and lowering pins 73 are lowered to place the wafer W in a position a little higher than the upper end part of the cup 75, for example, approximately 1 mm higher than the cup 75.

Next, the developing solution supply nozzle 90 which is kept on stand-by in the washing tank 98 is moved from the washing tank 98 to a position above the collecting plate 84 between the washing tank 98 and the cup side portion 76. In this position, the developing solution supply nozzle 90 starts to discharge the developing solution and continues to discharge for testing until a stable discharge condition is obtained.

When the stable discharge condition of the developing solution is obtained, the developing solution supply nozzle 90 moves above the wafer W across the upper end part of the cup 75 while discharging the developing solution and moves to the outside of the cup side portion 76 on the washing tank 99 side. At this time, the developing solution is supplied all over the surface of the wafer W to form the solution film of the developing solution on the wafer W.

Thereafter, the developing solution supply nozzle 90 is returned to the washing tank 98 and static development is started on the wafer W to be performed for a predetermined period of time. At this time, the cup side portion 76 is raised to cause the upper end part of the cup side portion 76 to be higher than the position of the wafer W. Incidentally, during the static development, the opening 82 is made wider due to the ascent of the cup side portion 76 to cause the air which is supplied from the upper part to flow mainly outside the cup 75, flow into the cup 75 again from the opening 82, and be exhausted from the exhaust pipe 80.

When the predetermined period time passes and the static development is finished, the hoisting and lowering pins 73 are lowered to cause the wafer W to be held on the spin chuck 71 by suction. Furthermore, the cup side portion 76 is also lowered to cause the wafer W to be positioned in the center part of the cup 75 and to narrow the opening 82 so that the air which is supplied from the upper part directly flows mainly into the cup 75. At this time, the washing fluid supply nozzle 100 is moved on the rail 102 to be positioned above the center of the wafer W.

The wafer W is then rotated at a predetermined rotational speed, for example, at 2000 rpm and is supplied with the washing fluid onto the center thereof. Thereby, the developing solution on the wafer W is scattered due to a centrifugal force. At this time, mist of the developing solution and so on occurs due to the scattering, but most of the mist is collected by the cup side portion 76 and the mist leaking outside the cup 75 is descended by the air, which flows from the upper part, in the outside area of the cup 75 to be collected by the collecting plate 84.

Then, the discharge of the washing fluid is stopped after the predetermined period of time passes and the rotational speed of the wafer W is increased, for example, to 4000 rpm. This causes the washing fluid on the wafer W to be scattered and the wafer W to be dried. After the wafer W is dried for a predetermined period of time, the rotation of the wafer W is stopped and the drying processing is finished.

Thereafter, the wafer W is raised again to the position above the upper end part of the cup 75 by the hoisting and lowering pins 73. The wafer W is then delivered to the main carrier 13 in the same way as when it is carried in to be carried outside the frame 15 and a series of the developing treatment is finished.

Next, the operation for maintenance such as washing of the cup 75 in the developing unit 18 will be explained. The fastening member 81 is first released from the connecting end portion 36a of the exhaust duct 36 to release the connection between the connecting end portion 80a of the exhaust pipe 80 and the connecting end portion 36a of the exhaust duct 36. This allows the cup accommodating section 70 to move freely.

Figure 11:
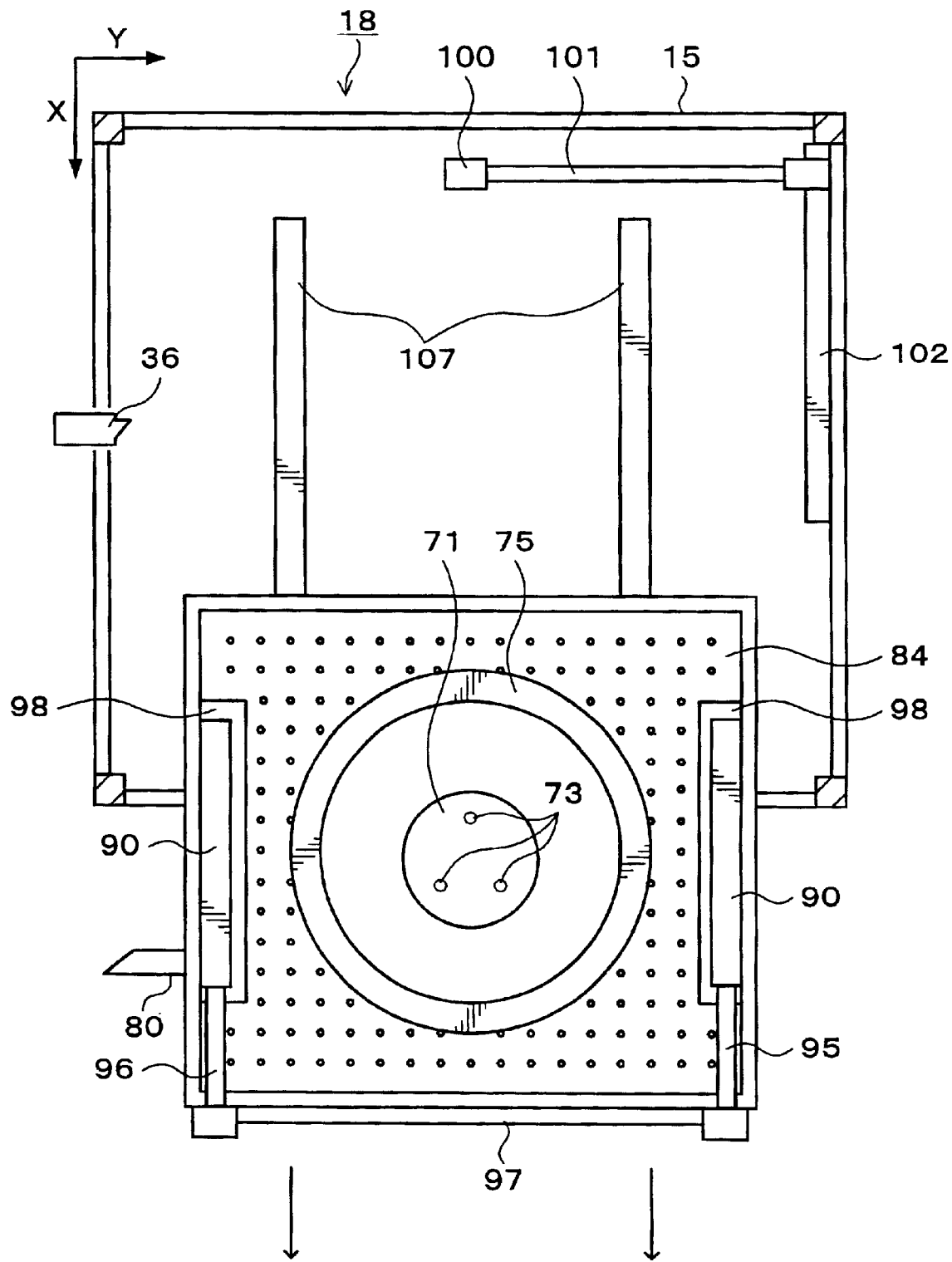
FIG. 11 is a plan view of the developing unit showing a state when a cup accommodating section is pulled out.

The cup accommodating section 70 is then moved in the positive direction of the X-direction along the rails 107 to be pulled out of the frame 15 as shown in FIG. 11. This makes it possible to detach the cup 75, the developing solution supply nozzles 90 and 91, and so on from the cup accommodating section 70 for performing maintenance such as the washing of the cup 75 and so on.

When the washing of the cup 75 and so on are finished, the cup accommodating section 70 is again moved in the negative direction of the X-direction along the rails 107 to be accommodated inside the frame 15. The exhaust pipe 80 and the exhaust duct 36 are then fixed to each other by the fastening member 81 to secure an exhaust route, and the maintenance is finished.

According to the above embodiment, the cup accommodating section 70 can be pulled out freely from the frame 15 so that space for the maintenance can be secured by pulling out the cup accommodating section 70 at the time of the maintenance. Particularly, even when the developing units 18 and 19 are disposed in multi-tiers as in this embodiment, the maintenance operation can also be performed appropriately by pulling out the cup accommodating section 70.

The exhaust pipe 80 and the exhaust duct 36 are detachably fixed and the air supply unit 87 is attached to the frame 15 so that the cup accommodating section 70 is movable even in the developing unit 18 which includes many piping systems. Especially due to the formation of the connecting end portion 80a of the exhaust pipe 80 and the connecting end portion 36a of the exhaust duct 36 in a slanting manner, they can be appropriately fixed and detached when they are moved in the moving direction of the cup accommodating section 70.

The cup side portion 76 is vertically movable so that the cup side portion 76 can be lowered when the developing solution supply nozzle 90 moves to the position above the wafer W, which shortens the distance where the developing solution supply nozzle 90 rises while avoiding the cup 75 and makes it possible to reduce thickness of the whole structure of the developing unit 18.

The developing solution supply nozzles 90 and 91 can be kept on stand-by in the different side parts of the cup accommodating section 70 respectively so that only one rail is required for moving both of the developing solution supply nozzles 90 and 91 thereon. This eliminates the necessity of providing two rails with different height from each other, and thereby, the height of the developing unit 18 can be decreased to reduce thickness of the developing unit 18.

Furthermore, the developing solution supply nozzles 90 and 91 are disposed on both of Y-direction side walls of the cup accommodating section 70 and, as a result, the washing fluid supply nozzle 100 is disposed on an X-direction side part of the cup accommodating section 70, which makes it possible to prevent the piping for supplying the washing fluid and the piping for supplying the developing solution from interfering with each other. Due to this structure, stand-by positions of the developing solution supply nozzles are separately disposed on each of the side walls of the accommodating vessel where the washing tanks are provided, and thereby, while a first one of the developing solution supply nozzles is in use, the other one of the developing solution supply nozzles can be kept on stand-by in the washing tank which is remotely disposed so as not to disturb the movement of the first developing solution supply nozzle.

The wafer W is hoisted and lowered by the hoisting and lowering pins 73 so that necessity of securing space in a vertical direction for hoisting and lowering is eliminated, compared with a conventional art where the spin chuck 71 and the drive mechanism 72 are hoisted and lowered together, and the height of the cup accommodating section 70 can be decreased more for that, which allows thickness of the developing unit 18 to be reduced.

The supply ducts 30 to 33 and the exhaust ducts 34 to 37 which are connected to respective solution treatment units inside the frame 15 are disposed concentratedly on different surfaces from each other so that the layout of the plural supply ducts and exhaust ducts is simplified to facilitate the installation of the ducts and to prevent the interference and so on between the ducts and other piping, even when the developing units 18 and 19 and the resist coating units 16 and 17 are disposed in multi-tiers as in this embodiment. The piping system in which the ducts branch off from one duct can also be adopted.

Figure 12:
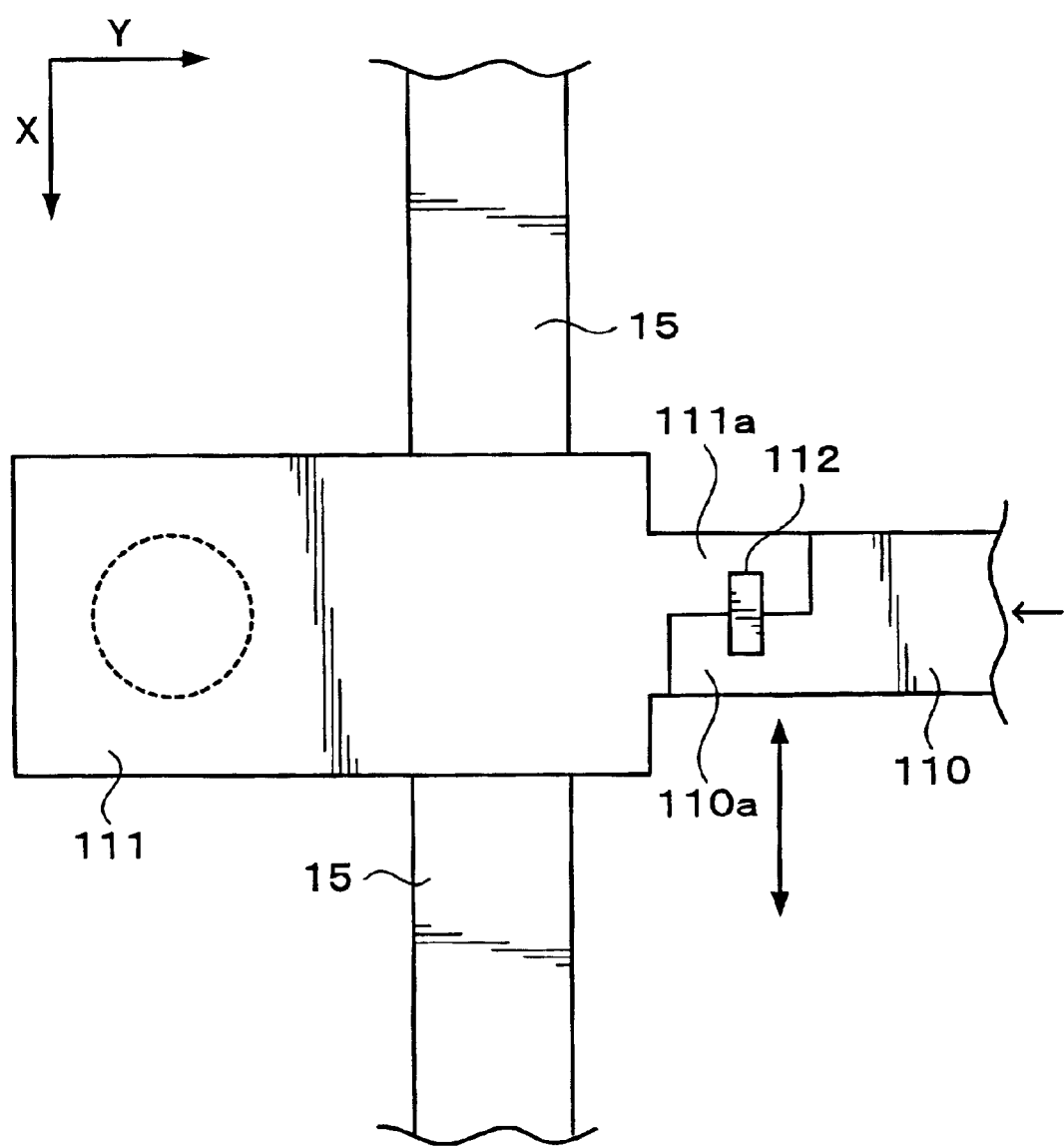
FIG. 12 is an explanatory plan view showing another example of the connecting part of the exhaust pipe and the exhaust duct.

The connecting end portion 36*a* of the exhaust duct 36 and the connecting end portion 80*a* of the exhaust pipe 80 are shaped to be slanted in the embodiment described above, but they may be formed in other shapes. For example, a connecting end portion 110*a* on the positive direction side of the X-direction (the lower side in FIG. 12) of an exhaust pipe 110 is protruded in a projecting shape when seen from its plane surface, as shown in FIG. 12. Meanwhile, a connecting end part 111*a* on the negative direction side of the X-direction of an exhaust duct 111 is protruded in a projecting shape to conform to the shape of the connecting end part 110*a*. A fastening member 112 for detachably fixing a protruding portion of the connecting end portion 110*a* to a protruding portion of the connecting end portion 111*a* is provided. This structure also enables the exhaust pipe 110 to be appropriately connected to or detached from the exhaust duct 111 when the cup accommodating section 70 is pulled out of or pushed into the frame 15 while moving in the X-direction.

Figure 13:
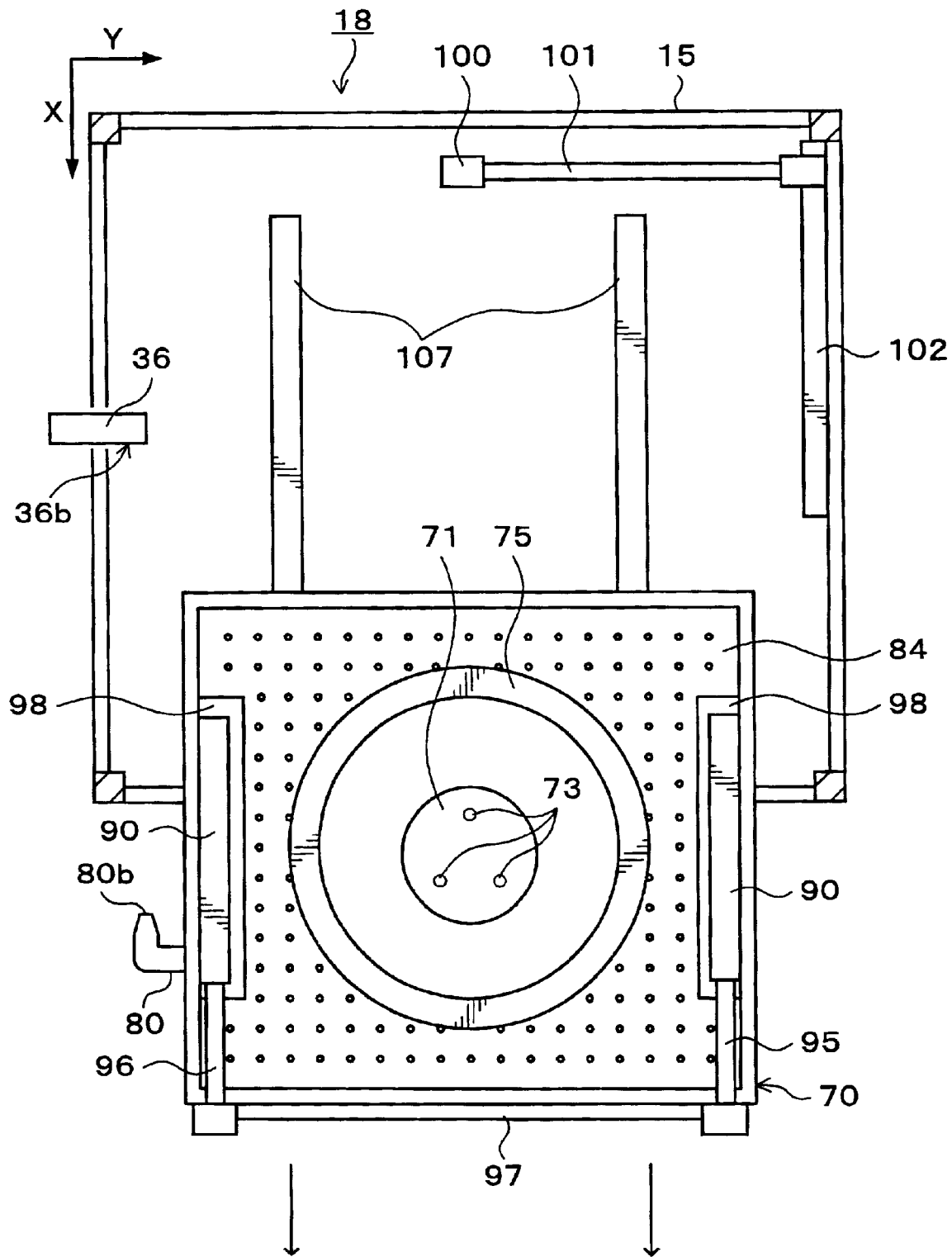
FIG. 13 shows still another example of the connecting part of the exhaust pipe and the exhaust duct and it is a plan view of the developing unit showing a state when the cup accommodating section is pulled out.
Figure 14:
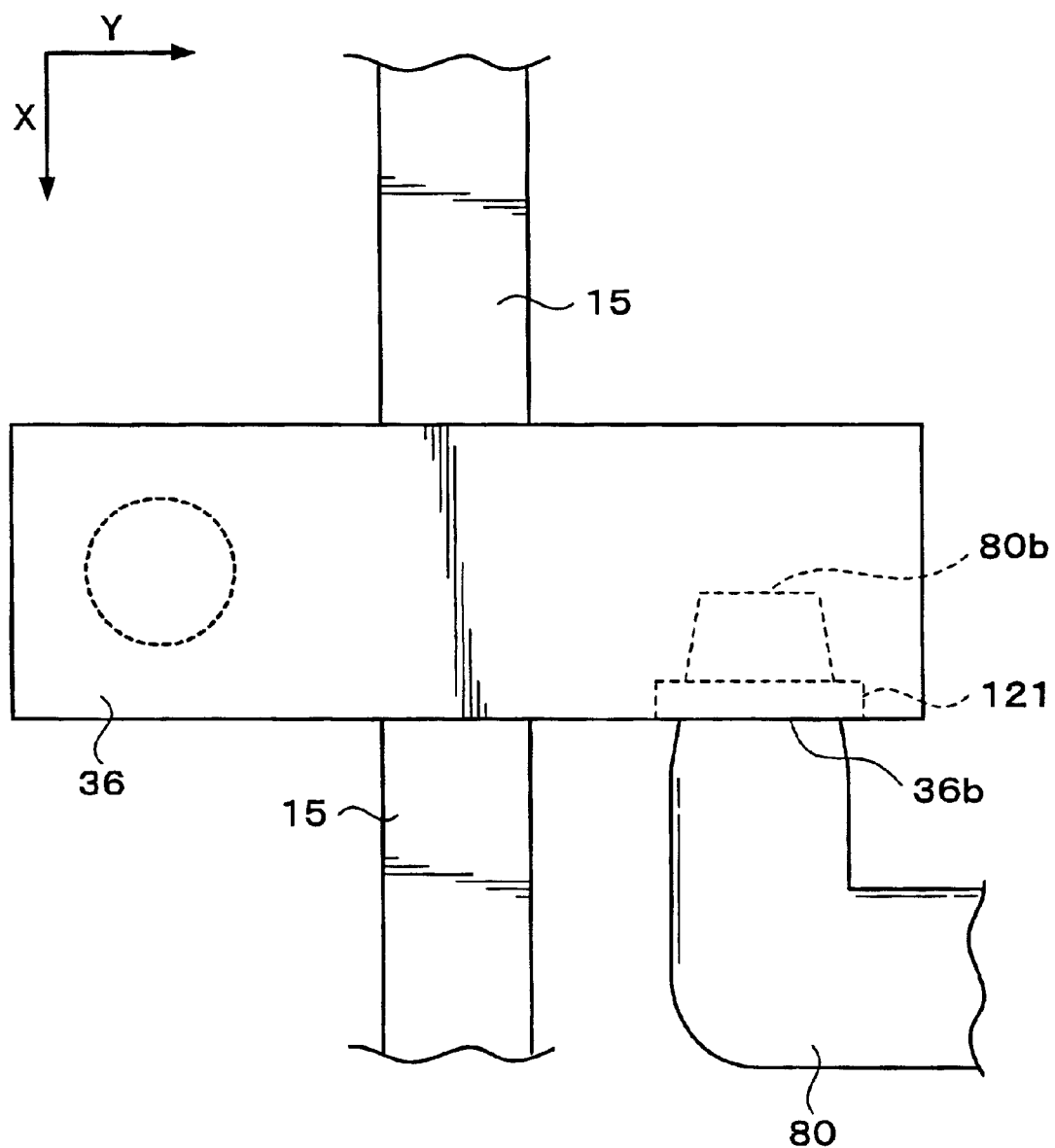
FIG. 14 is an explanatory plan view showing still another example of the connecting part of the exhaust pipe and the exhaust duct shown in FIG. 13.

Moreover, an example shown in FIG. 13 and FIG. 14 can also be proposed as a connecting method of the connecting end part of the exhaust duct 36 and the connecting end part of the exhaust pipe 80.

In this example, an end part of the exhaust pipe 80 is formed in a tapered shape and has a connecting end portion 80*b* protruding in a reverse direction of the pulled-out direction. A connecting end portion of the exhaust duct 36 is formed as an insertion port 36*b* which opens on the pulled-out direction side. A sponge material 121 for improving air-tightness is provided on an inner wall surface of the insertion port 36*b*.

According to the example described above, the exhaust pipe 80 and the exhaust duct 36 are easily detachable from each other simply by pulling out the cup accommodating section 70 in a forward direction. Furthermore, in order to connect the exhaust pipe 80 and the exhaust duct 36 to each other, the connecting end portion 80*b* in the end part of the exhaust pipe 80 is inserted into the insertion port 36*b* of the exhaust duct 36 simply by pushing in the cup accommodating section 70 so that the connecting operation is easily completed. At this time, the connecting end portion 80*b* of the exhaust pipe 80 can surely be inserted into the insertion port 36*b* to be in the connected state since the end part of the exhaust pipe 80 is formed in the tapered shape and the insertion port 36*b* is formed adjacent to the tip of the tapered shape.

In addition, the air-tightness is secured since the sponge material 121 is provided in the inner wall surface of the insertion port 36*b*. Various sealing materials, for example, a resilient material and the like, may be used instead of the sponge material.

In the above embodiment, an annular duct having a circular-shaped cross section is used for the exhaust pipe and the exhaust duct, but a rectangular duct having a rectangular-shaped cross section may alternatively be used. Particularly, when the rectangular duct is used, the connecting end part 110*a* and the connecting end part 111*a* in the protruding shape which are described above have an advantage that they are more easily formed.

The present invention is realized as the developing unit 18 in the above embodiment, but is applicable to other solution treatment units, for example, the resist coating unit 16, 17, 21, or 22 and the developing unit 19, 23, or 24. Furthermore, the present invention may be applied to all of the developing units 19, 23, and 24 and the resist coating units 16, 17, 21, and 22 or may be applied only to selected ones among them.

In the embodiment explained above, the present invention is applied to the developing unit for the wafer in the photolithography process of the semiconductor wafer device fabrication processes, but the present invention is also applicable to a solution treatment unit for substrates other than the semiconductor wafer, for example, an LCD substrate.

According to the present invention, the work space for performing the maintenance can be sufficiently secured even when the solution treatment units are multi-tierd so that the maintenance operation for the solution treatment unit can be efficiently and easily performed.

Moreover, according to the present invention, the thickness of the solution treatment unit is reduced so that the solution treatment units can be disposed in more tiers, which makes it possible to combine many solution treatment units inside the system without increase in an occupied floor area.

Figure 15:
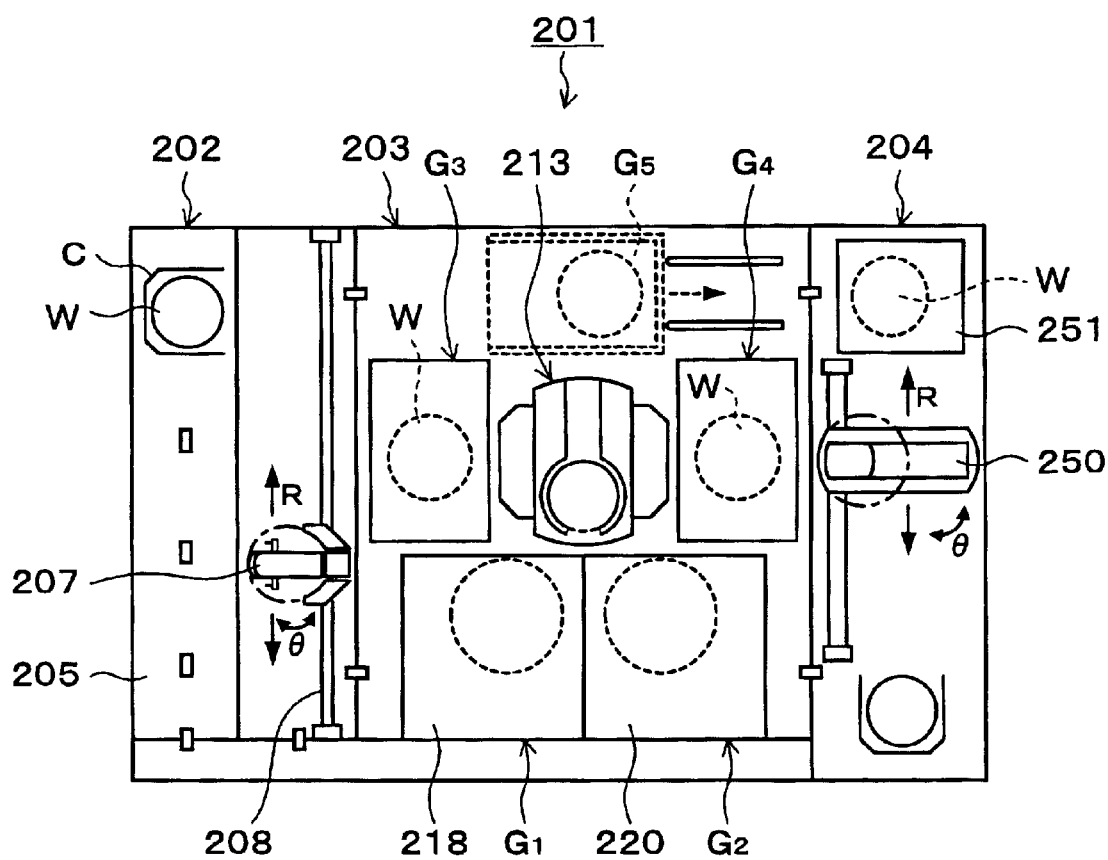
FIG. 15 is a plan view showing a schematic structure of a coating and developing treatment system including a developing unit according to another embodiment of the present invention.
Figure 16:
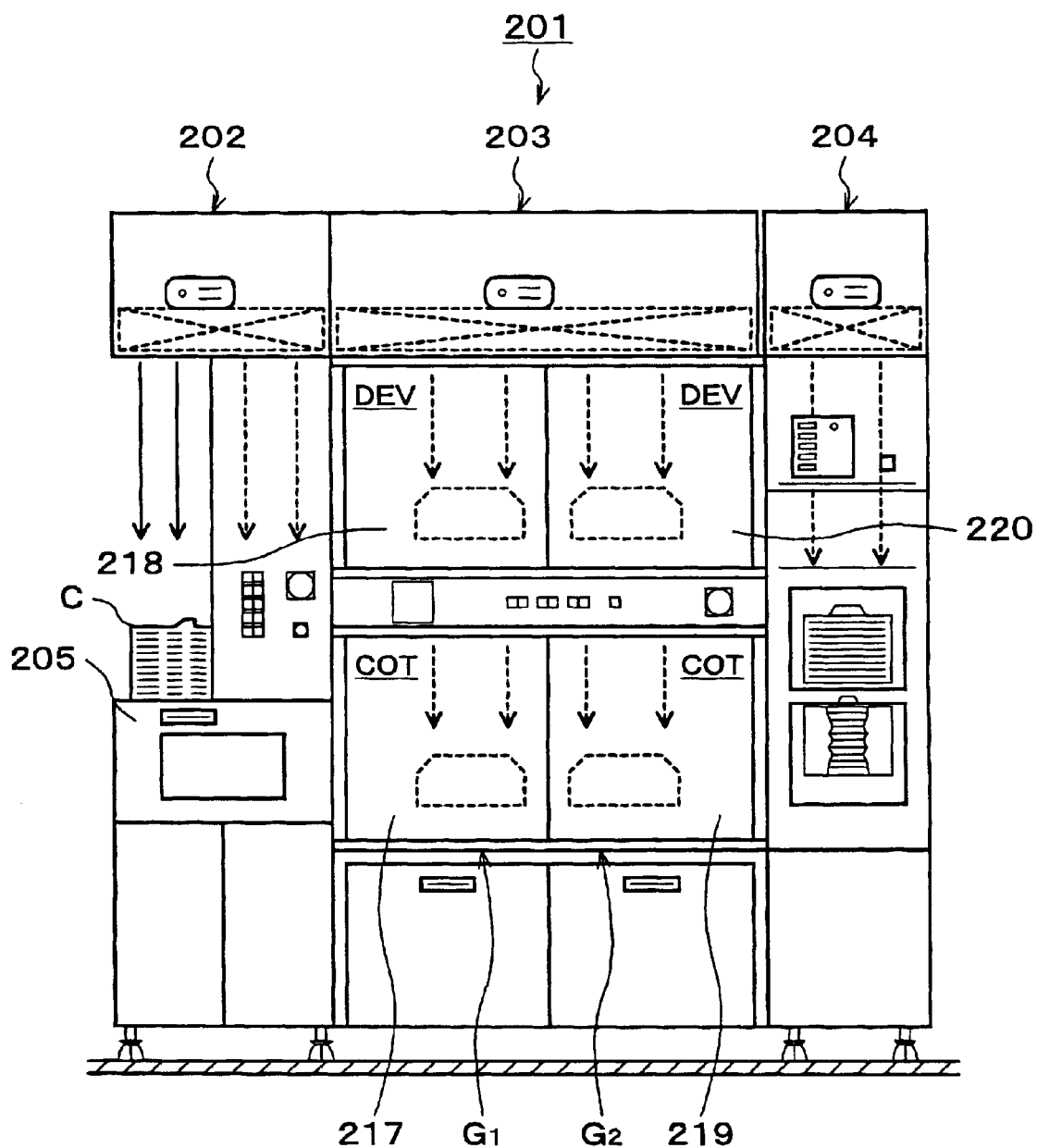
FIG. 16 is a front view of the coating and developing treatment system in FIG. 15.
Figure 17:
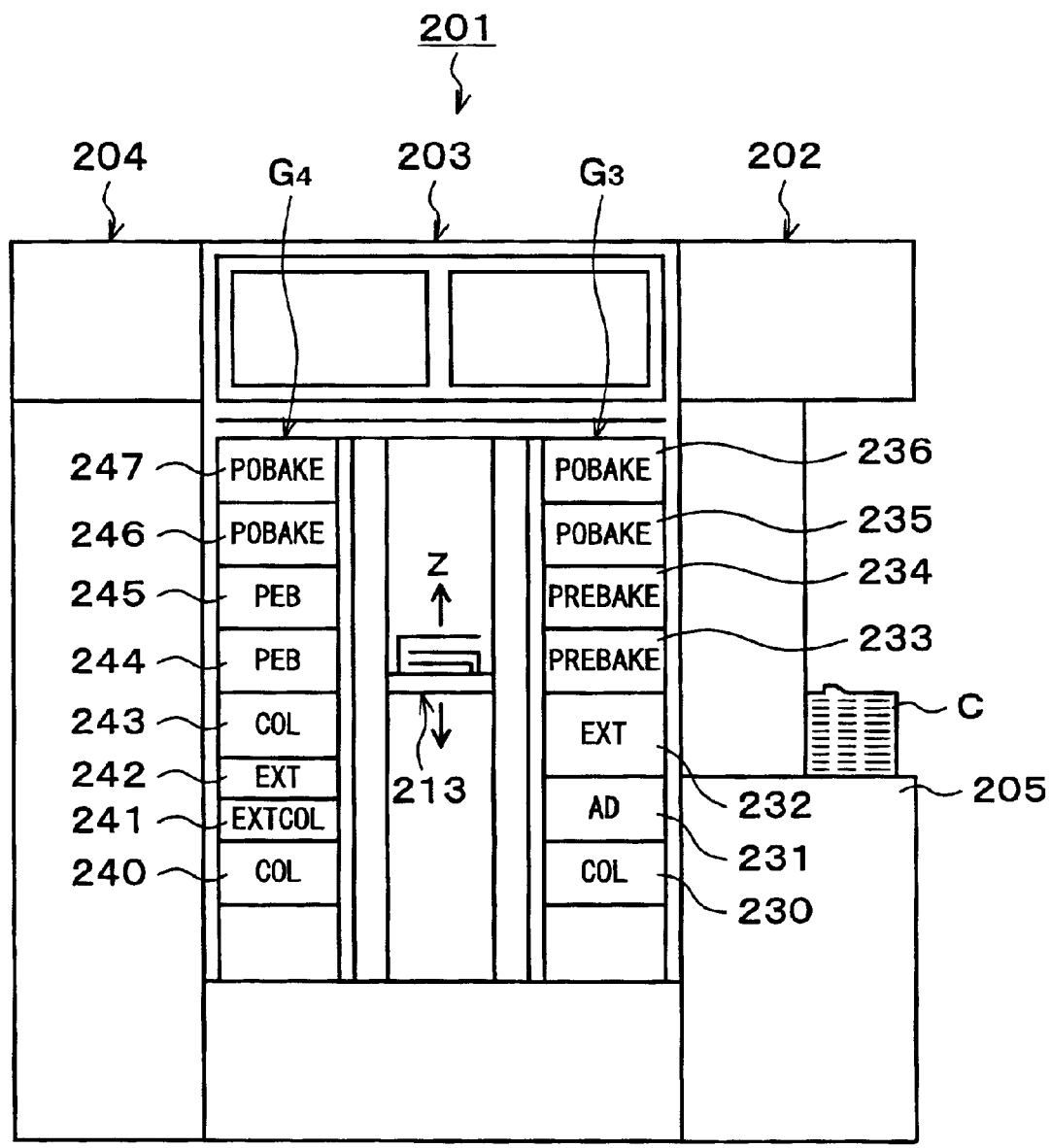
FIG. 17 is a rear view of the coating and developing treatment system in FIG. 15.

Another embodiment of the present invention will be described next. FIG. 15 is a plan view of a coating and developing treatment system 201 including a developing unit according to the present invention, FIG. 16 is a front view of the coating and developing treatment system 201, and FIG. 17 is a rear view of the coating and developing treatment system 201.

As shown in FIG. 15, the coating and developing treatment system 201 has a structure in which a cassette station 202 for carrying, for example, 25 wafers W in a unit of cassette from/to the outside to/from the coating and developing treatment system 201 and for carrying the wafers W to/from a cassette C, a processing station 203 composed of various kinds of processing units which are disposed in multi-tiers, for performing predetermined processing for the wafers W one by one in coating and developing processes, and an interface section 204 for delivering the wafers W to/from a not-shown aligner which is disposed adjacent to the processing station 203 are integrally connected.

In the cassette station 202, a plurality of the cassettes C are mountable in predetermined positions on a cassette mounting table 205, which serves as a mounting portion, in a line in the R-direction (the vertical direction in FIG. 15). Furthermore, a wafer carrier 207, which is movable in the alignment direction of the cassettes (the R-direction) and in an alignment direction of the wafers W housed in the cassette C (the Z-direction; the perpendicular direction), is provided to be movable along a carrier path 208 so that it is selectively accessible to each of the cassettes C.

The wafer carrier 207 has an alignment function for aligning the wafers W. The wafer carrier 207 is structured so as to be also accessible to an extension unit 232 included in a third processing unit group G3 on a processing station 203 side as will be described later.

In the processing station 203, a main carrier 213 is provided in a center part thereof, and various kinds of the processing units are multi-tiered on a periphery of the main carrier 213 to constitute processing unit groups. In the coating and developing treatment system 201, where four processing unit groups G1, G2, G3 and G4 are provided, the first and the second processing unit groups G1 and G2 are disposed on a front side of the coating and developing treatment system 201, the third processing unit group G3 is disposed adjacent to the cassette station 202, and the fourth processing unit group G4 is disposed adjacent to the interface section 204. Furthermore, a fifth processing unit group G5 depicted by the broken line is allowed to be additionally disposed on a rear side as an option. The main carrier 213 is capable of carrying the wafers W to/from various kinds of later described processing units which are disposed in these processing unit groups G1, G2, G3, and G4. Incidentally, the number and the arrangement of the processing unit groups vary depending on which kind of processing is performed on the wafers W and the number of the processing unit groups may be selectively changed.

In the first processing unit group G1, for example, as shown in FIG. 16, a resist coating unit 217 for supplying a resist solution onto the wafer W to form a resist film and a developing unit 218 according to this embodiment are two-tiered in the order from the bottom. Similarly, in the second processing unit group G2, a resist coating unit 219 and a developing unit 220 are two-tiered in the order from the bottom.

In the third processing unit group G3, for example, as shown in FIG. 17, a cooling unit 230 for cooling the wafers W, an adhesion unit 231 for increasing fixability between the resist solution and the wafers W, the extension unit 232 for keeping the wafers W on stand-by therein, pre-baking units 233 and 234 for drying a solvent in the resist solution, post-baking units 235 and 236 for performing heat treatment after the developing treatment, and so on are, for example, seven-tiered in the order from the bottom.

In the fourth processing unit group G4, for example, a cooling unit 240, an extension and cooling unit 241 for spontaneously cooling the mounted wafers W, an extension unit 242, a cooling unit 243, post-exposure baking units 244 and 245 for performing heat treatment after the exposure processing, post-baking units 246 and 247, and so on are, for example, eight-tiered in the order from the bottom.

In a center part of the interface section 204, a wafer carrier 250 is provided. The wafer carrier 250 is structured so as to be movable in the R-direction (the vertical direction in FIG. 15) and the Z-direction (the perpendicular direction), and to be rotatable in the θ direction (a rotational direction about an axis Z), so that it is accessible to the extension and cooling unit 241 and the extension unit 242 which are included in the fourth processing unit group G4, a peripheral aligner 251, and the not-shown aligner to carry the wafers W to each of them.

Figure 18:
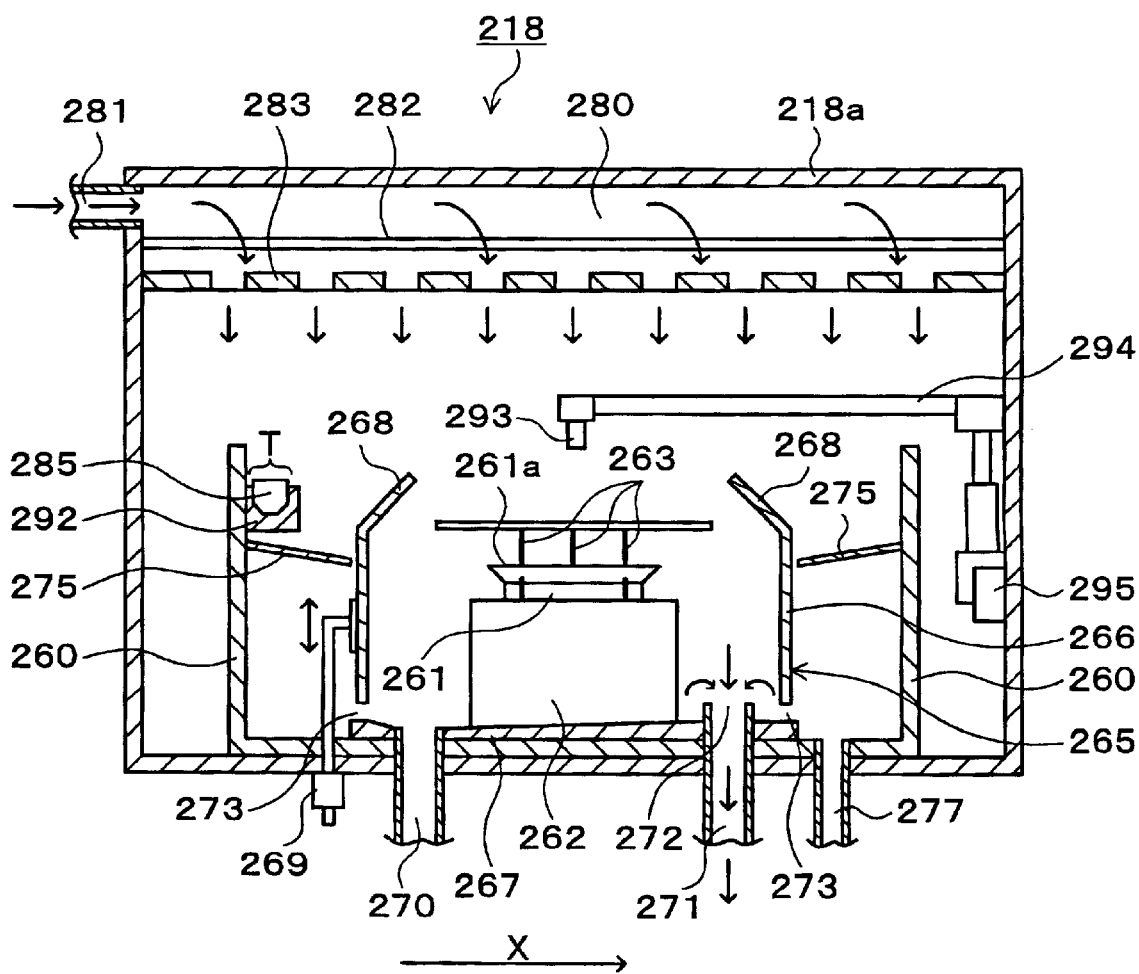
FIG. 18 is an explanatory view of a vertical cross section of the developing unit according to another embodiment.
Figure 19:
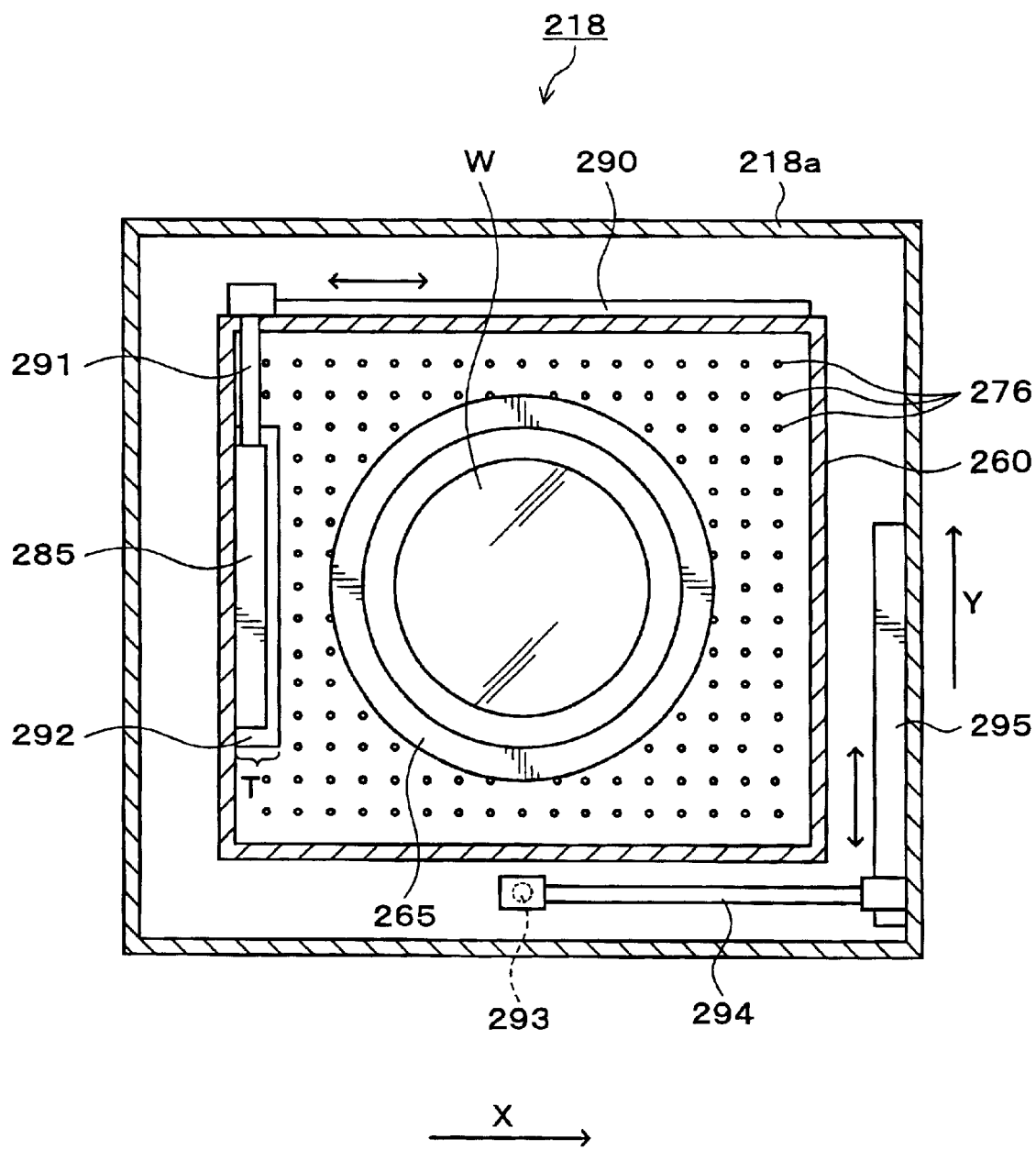
FIG. 19 is an explanatory view of a horizontal cross section of the developing unit in FIG. 18.

Next, the structure of the developing unit 218 described above will be explained in detail. FIG. 18 is an explanatory view of a vertical cross section showing a schematic structure of the developing unit 218 and FIG. 19 is an explanatory view of a horizontal cross section of the developing unit 218.

The developing unit 218 has inside a casing 218a a box-shaped cup accommodating section 260 with an upper part thereof being open as shown in FIG. 18. In a center part of the cup accommodating section 260, a spin chuck 261 having an upper surface portion 261a formed to be horizontal and circular-shaped is provided and is structured to be able to horizontally hold the wafer W. The spin chuck 261 is provided with a not-shown suction port, for example, on the upper surface portion 261a thereof to hold the wafer W by suction. Under the spin chuck 261, a drive mechanism 262 for rotating the spin chuck 261 is provided to rotate the wafer W held on the spin chuck 261 at a selective rotational speed.

On a peripheral part of the upper surface portion 261a of the spin chuck 261, a plurality of hoisting and lowering pins 263 for supporting and hoisting/lowering the wafer W are provided. The hoisting and lowering pins 263 are structured to be able to ascend and descend to a predetermined height by the drive mechanism 262, and they ascend and descend through not-shown through holes which are formed in the upper surface portion 261a of the spin chuck 261, which makes it possible to place the wafer W in a predetermined position above the spin chuck 261 and mount the wafer W onto the spin chuck 261.

Outside an outer circumference of the spin chuck 261, a cylindrical-shaped cup 265 with an upper part thereof being open is provided to enclose the spin chuck 261 to receive therein the developing solution and so on which scatter when the wafer W is rotated and to prevent the contamination inside the casing 218a. The cup 265 has a cup side portion 266 for receiving the scattered developing solution and so on and a cup bottom portion 267 for collecting the received developing solution and so on.

A guide member 268 inclined in an inner direction is formed in an upper part of the cup side portion 266 to receive the developing solution and so on which scatter above the wafer W and to divide the air current from the upper part to flow into the inside of the cup 265 and to flow out of the cup 265. To the cup side portion 266, a hoisting and lowering mechanism 269, which works as a vessel drive unit, for example, a motor, a cylinder, or the like, for vertically moving only the cup side portion 266 is attached so that the cup side portion 266 can be hoisted and lowered by stages, for example, by two stages, or continuously as required.

The cup bottom portion 267 is disposed in a slanting manner, and in a lower part thereof, a drain pipe 270 for discharging the developing solution and so on which are collected in the cup side portion 266 is provided. In the cup bottom portion 267, an exhaust pipe 271, which works as an exhaust section, for exhausting an atmosphere inside the casing 218a is provided and an exhaust port 272 of the exhaust pipe 271 is disposed to face upward inside the cup 265.

An opening 273, which works as a flow-in port, is provided between a lower end part of the cup side portion 266 and the cup bottom portion 267 to allow gas which temporarily flows out of the cup 265 from the upper part to flow into the cup 265 from the opening 273. The width of the opening 273 is changed by the vertical movement of the cup side portion 266 mentioned above, and as a result, a flow rate of the gas flowing into the cup 265 from the opening 273 is adjusted. Therefore, under the condition that a fixed flow rate of the gas is supplied from the upper part and a fixed flow rate of the gas is exhausted from the inside of the cup 265, flow rates of the gas flowing into and out of the cup 265 which are divided by the guide member 268 are adjustable by the variation of the width of the opening 273.

Outside an outer circumference of the cup 265, a collecting plate 275 for covering space between the cup 265 and the cup accommodating section 260 is provided to collect the developing solution and so on leaking out of the cup 265 due to the movement which is caused when a later-described developing solution supply nozzle 285 supplies the developing solution onto the wafer W.

The collecting plate 275 is formed to be slanted with a part thereof on a cup 265 side being lower. In the collecting plate 275, a number of ventilation holes 276 are formed as shown in FIG. 19 so that a mist current including the developing solution and the washing fluid which stir up across the guide member 268 during the processes, the gas from the upper part which flows out of the cup 265 in the processes, and so on pass through the ventilation holes 276 to flow into the opening 273. When the mist current passes through the ventilation holes 276, the mist is easily trapped by the collecting plate 275.

A drain pipe 277 for discharging the above-mentioned developing solution and so on leaking out of the cup 265 is provided in a bottom part of the cup accommodating section 260 between the outer circumference of the cup 265 and the cup accommodating section 260.

In an upper part inside the casing 218a, an air supply mechanism 280, which works as a gas supply section for supplying the inside of the casing 218a with gas, for example, the atmosphere or air whose temperature and humidity are adjusted to predetermined values is provided. To an upper part of a side wall of the casing 218a, a supply pipe 281 for supplying air from a not-shown air supply source to the air supply mechanism 280 is attached.

The air supply mechanism 280 has a filter 282 for removing impurities included in the air which is supplied from the supply pipe 281 and a current plate 283 for uniformly supplying the air purified by the filter 282 to all over the casing 218a. The air supply mechanism 280 causes a uniform descending air current to be formed inside the casing 218a so that temperature and humidity inside the casing 218a are made adjustable and the inside the casing 218a can be purged.

Figure 20:
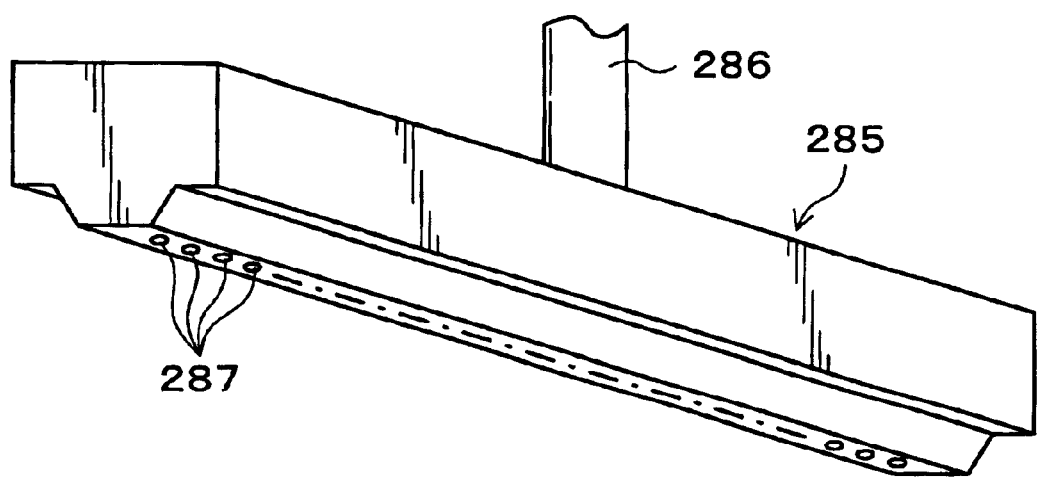
FIG. 20 is a perspective view of a developing solution supply nozzle used in the developing unit in FIG. 18.
Figure 21:
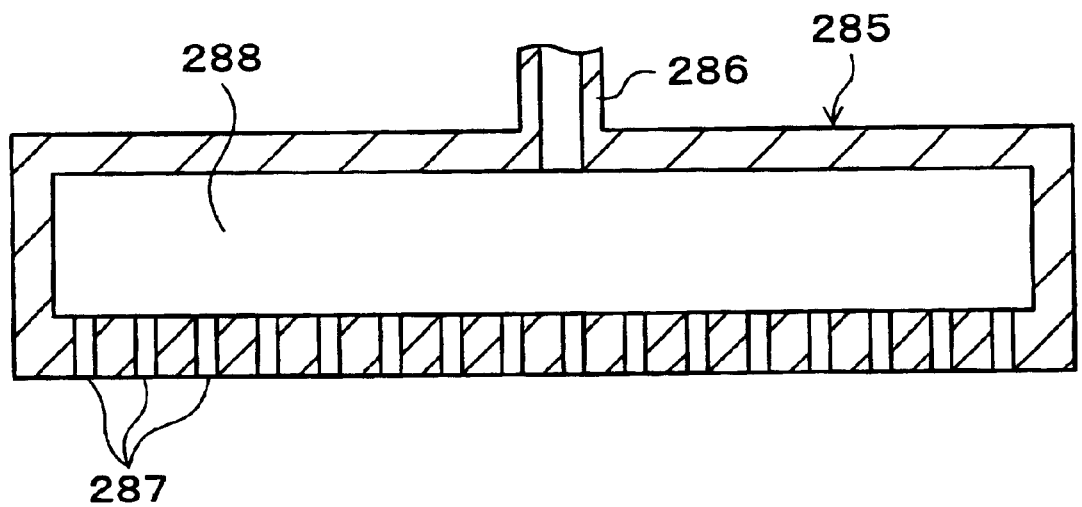
FIG. 21 is a vertical sectional view of the developing solution supply nozzle in FIG. 20.

A developing solution supply nozzle 285 for supplying the developing solution onto the wafer W is disposed in a stand-by position T which is provided on an inner wall on the negative direction side of the X-direction (the left direction in FIG. 19) of the cup accommodating section 260, as shown in FIG. 18 and FIG. 19. The developing solution supply nozzle 285 is formed to be long and slender as shown in FIG. 19 and FIG. 20 and its length is longer at least than the diameter of the wafer W. One end of a pipe 286 for having the developing solution from a not-shown developing solution supply source flow therefrom into the developing solution supply nozzle 285 is connected to an upper surface of the developing solution supply nozzle 285. In a bottom part of the developing solution supply nozzle 285, a plurality of developing solution supply ports 287 are disposed in a line along a longitudinal direction. Inside the developing solution supply nozzle 285, a space portion 288 which is long in the longitudinal direction and which is communicated with the pipe 286 and each of the developing solution supply ports 287 is formed as shown in FIG. 21, and it is structured to be capable of temporarily storing the developing solution which flows into the developing solution supply nozzle 285 from the pipe 286 and discharging the developing solution stored in the space portion 288 from each of the developing solution supply ports 287 simultaneously at the same flow rate.

The developing solution supply nozzle 285 is held by an arm 291, which is movable on a rail 290 extending in the X-direction as shown in FIG. 19, with its longitudinal direction being the Y-direction. The rail 290 extends from an end part on the negative direction side of the X-direction to an end part on the positive direction side of the X- direction of the cup accommodating section 260 and is attached on an outer surface on the positive direction side of the Y-direction of the cup accommodating section 260. The moving speed and moving timing of the arm 291 are controlled by a not-shown drive control mechanism. Thereby, the developing solution supply nozzle 285 which is supported by the arm 291 is capable of discharging a predetermined flow rate of the developing solution and supplying the developing solution all over the wafer W to form a solution film of the developing solution with predetermined thickness on the wafer W while moving in the X-direction at a predetermined speed. A not-shown moving mechanism for vertically moving the arm 291 is provided in the arm 291 so that distance between the developing solution supply nozzle 285 and the wafer W is adjustable.

A washing tank 292 for washing the developing solution supply nozzle 285 is provided in the stand-by position T. The washing tank 292 is formed to have a recessed-shaped cross section to receive the long and slender developing solution supply nozzle 285 therein, and a predetermined solvent for washing off the developing solution which adheres to the developing solution supply nozzle 285 is stored inside the washing tank 292.

A washing fluid supply nozzle 293 for supplying a washing fluid, for example, pure water, to the wafer W is provided outside a side wall on the negative direction side of the Y-direction of the cup accommodating section 260. The washing fluid supply nozzle 293 is supported by the arm 294 and the arm 294 is movable on the rail 295 extending in the Y-direction. The rail 295, which extends from an end part on the negative direction side of the Y-direction of the cup accommodating section 260 to a position across a center part of the spin chuck 261, is provided in the casing 218a. A not-shown drive mechanism is provided in the arm 294 and the arm 294 is moved on the rail 295 by the drive mechanism. This enables the washing fluid supply nozzle 293 to move from the aforesaid position outside the cup accommodating section 260 to the center part of the wafer W to supply the washing fluid to the center of the wafer W, when necessary. A not-shown moving mechanism for vertically moving the arm 294 is provided in the arm 294 so that the distance to the wafer W is adjustable as required.

Next, the operation of the developing unit 218 as structured above is explained together with the steps of a photolithography process performed in the coating and developing treatment system 201.

First, the wafer carrier 207 takes out one unprocessed wafer W from the cassette C and carries it to the adhesion unit 231 which is included in the third processing unit group G3. The wafer W, which is coated with an adhesion promoter such as HMDS for improving fixability with the resist solution in the adhesion unit 231, is carried to the cooling unit 230 by the main carrier 213 and cooled to a predetermined temperature. Thereafter, the wafer W is carried to the resist coating unit 217 or 219 and the pre-baking unit 234 or 235 in sequence to undergo predetermined processing. The wafer W is then carried to the extension and cooling unit 241.

Then, the wafer W is taken out from the extension and cooling unit 241 by the wafer carrier 250 and thereafter, carried to the aligner (not shown) via the peripheral aligner 251. The wafer W after undergoing the exposure processing is carried to the extension unit 242 by the wafer carrier 250 and thereafter, is held by the main carrier 213. Next, the wafer W is carried to the post-exposure baking unit 244 or 245 and the cooling unit 243 in sequence, and after undergoing predetermined processing in each of the units, is returned to the developing unit 218 or 220.

The wafer W after undergoing the developing treatment is carried again to the post-baking unit 235, 236, 246, or 247 and the cooling unit 230 in sequence by the main carrier 213 to undergo predetermined processing in each of the units. After that, the wafer W is returned to the cassette C by the wafer carrier 207 via the extension unit 232 and a series of predetermined coating and developing treatment is finished.

The operation of the above-described developing unit 218 will be explained in detail next. First, before the developing treatment is started (before the wafer W is carried in), the air whose temperature and humidity are adjusted to the predetermined values is supplied from the air supply mechanism 280 to form the uniform descending air current all over the casing 218a. The atmosphere inside the casing 218a is constantly exhausted at a fixed flow rate from the exhaust port 272 to purge the inside of the casing 218a. At this time, the cup side portion 266 is in a descending state to narrow the opening 273 so that the air from the upper part is exhausted mainly via the inside of the cup 265.

Figure 22:
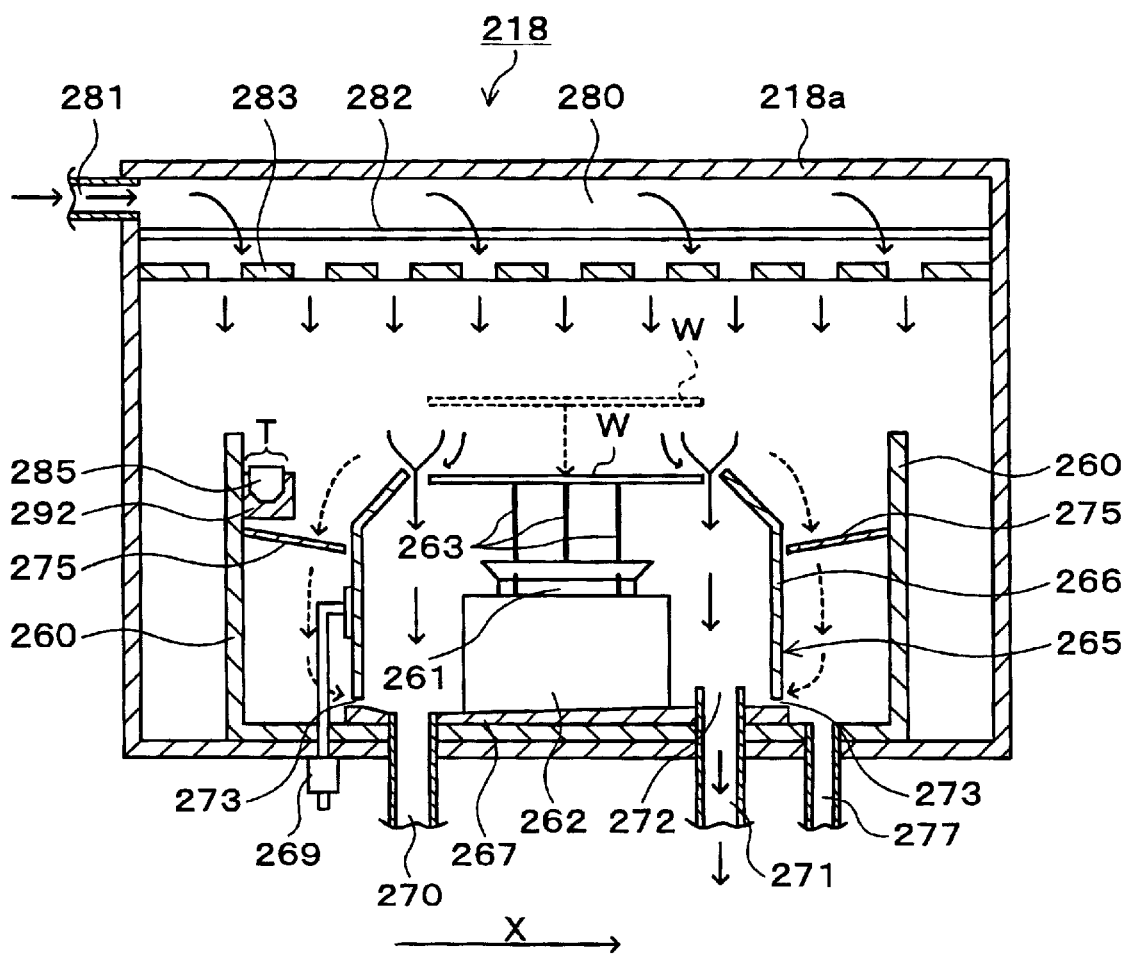
FIG. 22 is an explanatory view showing a state inside the developing unit when a developing solution is to be supplied onto a wafer.

Then, when the developing treatment is started (the wafer W is carried in), the hoisting and lowering pins 263 are first hoisted to a position higher than an upper end part of the cup 265 so that the wafer W delivered into the casing 218a by the main carrier 213 is held on the hoisting and lowering pins 263 to be delivered to the hoisting and lowering pins 263. The hoisting and lowering pins 263 are then lowered as shown in FIG. 22 to cause the wafer W to be in a position a little higher than the upper end part of the cup 265, for example, approximately 1 mm higher than the cup 265. Incidentally, at this time, the width of the opening 273 is made narrow so that the air from the upper part is exhausted mainly via an area around the wafer W and further through the inside of the cup 265.

Figure 23:
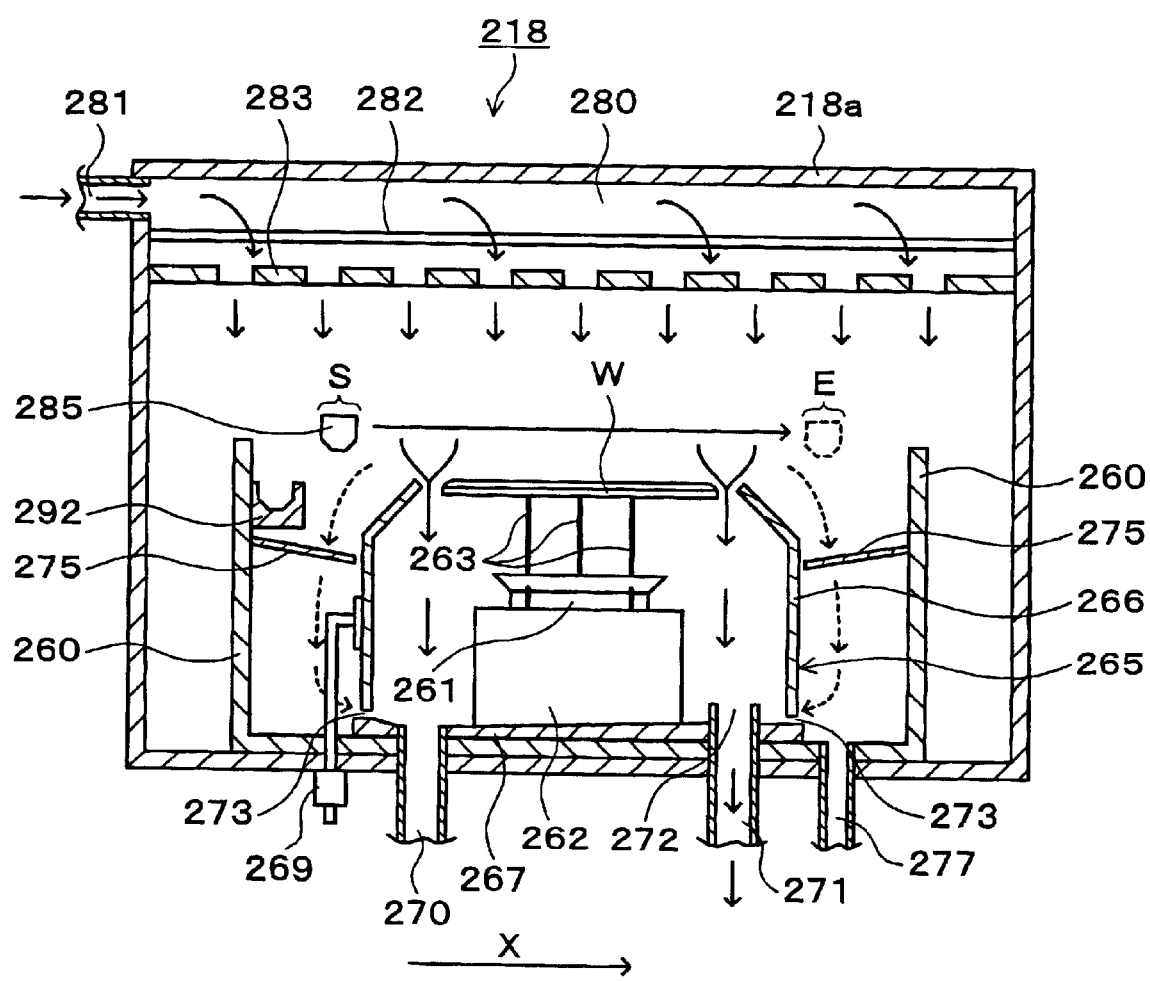
FIG. 23 is an explanatory view showing a state inside the developing unit while the developing solution is being supplied onto the wafer.

Next, the developing solution supply nozzle 285 which is kept on stand-by in the washing tank 292 in the stand-by position T is moved to a position S which is inside the cup accommodating section 260 and is outside the cup side portion 266 on the negative direction side of the X-direction, as shown in FIG. 23. In this position S, the developing solution supply nozzle 285 starts to discharge the developing solution and continues to discharge for testing until a stable discharge condition is obtained.

When the stable discharge condition of the developing solution is obtained, the developing solution supply nozzle 285 moves to a position E which is outside the cup side portion 266 on the positive direction side of the X-direction while discharging the developing solution and supplies the developing solution all over the wafer W to form the solution film of the developing solution on the wafer W. Thereafter, the developing solution supply nozzle 285 is returned to the stand-by position T. During this time, the cup side portion 266 maintains its descending state and the air from the upper part directly flows into the cup 265 mainly from the upper end part of the cup 265 and is exhausted from the exhaust port 272. In other words, the flow rate of the air flowing into the cup 265 is maintained to be higher than the flow rate of the air flowing out of the cup 265. Incidentally, the position S may be positioned at such a distance away from the edge of the wafer W that a predetermined period of time required for the stable discharge condition to be obtained passes before the developing solution supply nozzle 285 reaches the edge of the wafer W.

Figure 24:
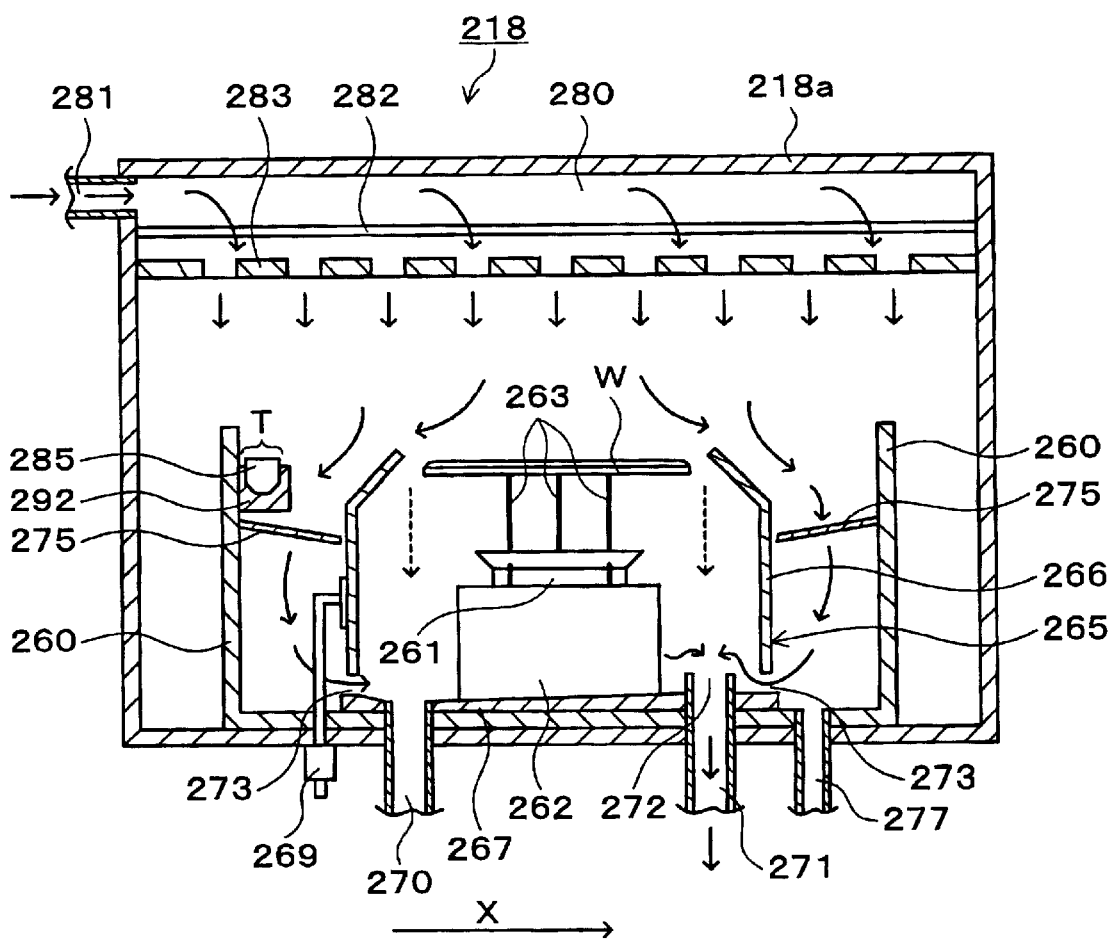
FIG. 24 is an explanatory view showing a state inside the developing unit when the wafer is developed.

When the solution film of the developing solution is formed on the wafer W, static development for a predetermined period of time is started. At this time, the cup side portion 266 is raised. This causes the wafer W to be in a position lower than the upper end part of the cup 265, as shown in FIG. 24. Moreover, the width of the opening 273 is made wider due to the ascent of the cup side portion 266 and the open part at the upper end of the cup 265 is made narrower due to the wafer W, which works as resistance when the air flows so that the air flowing out of the cup 265 increases and the air flowing into the cup 265 greatly decreases. The air passes through the ventilation holes 276 of the collecting plate 275, further passes through the opening 273, and then, is exhausted from the exhaust port 272 which is inside the cup 265.

Figure 25:
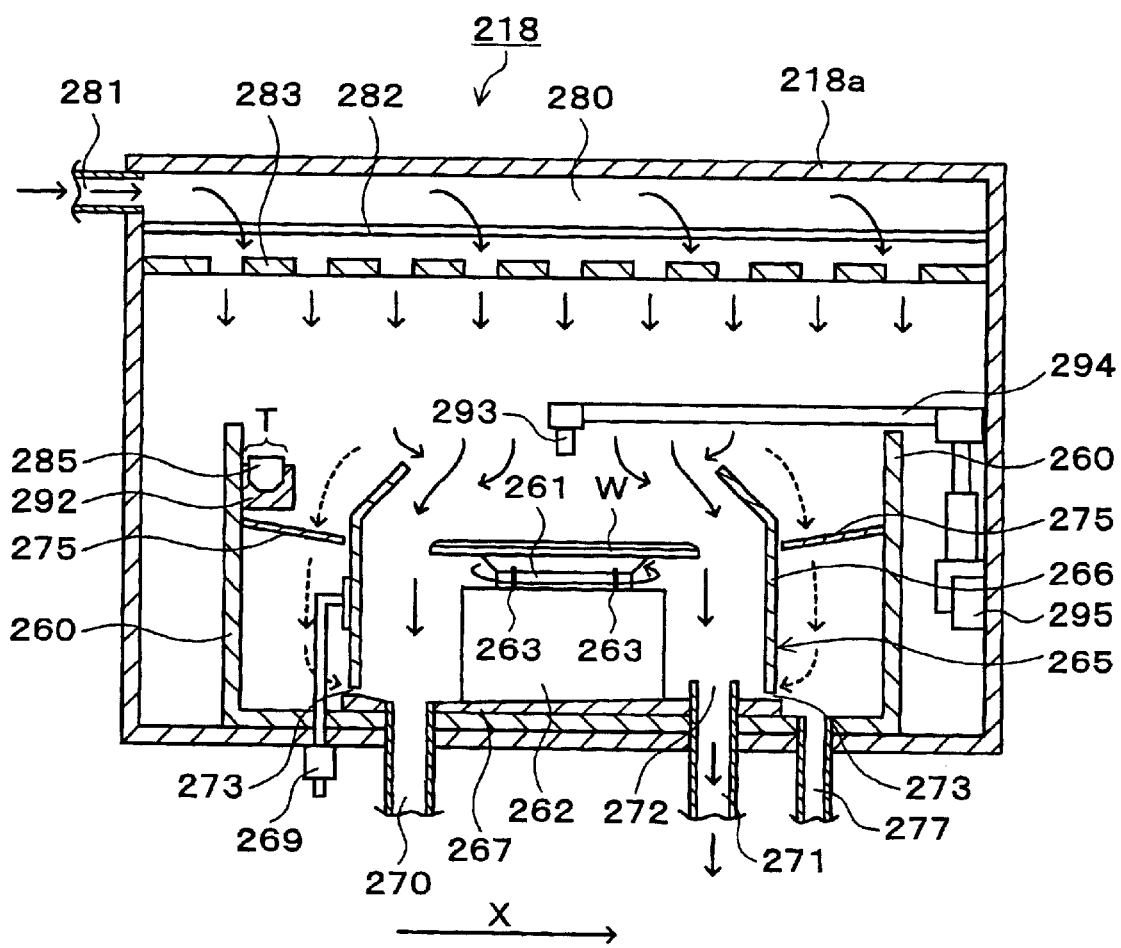
FIG. 25 is an explanatory view showing a state inside the developing unit when the wafer is washed and dried.

When the predetermined period of time passes and the static development is finished, the hoisting and lowering pins 263 lower as shown in FIG. 25 so that the wafer W is held onto the spin chuck 261 by suction. The cup side portion 266 also lowers to cause the wafer W to be in the center part of the cup 265 and at the same time, to make the opening 273 narrower so that the flow rate of the air directly flowing into the cup 265 is adjusted to be higher than the flow rate of the air flowing out of the cup 265. At this time, the washing fluid supply nozzle 293 moves to a position above the center of the wafer W.

The wafer W is then rotated at a predetermined rotational speed, for example, at 2000 rpm and is supplied with the washing fluid onto the center thereof. Thereby, the developing solution on the wafer W is scattered due to a centrifugal force. At this time, mist of the developing solution and so on occurs due to the scattering, but the mist is carried to an area under the wafer W by the air directly flowing into the cup 265 from the upper part and is exhausted from the exhaust port 272. Incidentally, part of the mist flowing out of the cup 265 is descended in the area outside the cup 265 due to weak air flowing in the area outside the cup 265 and flows into the cup 265 from the opening 273 to be exhausted from the exhaust port 272.

Then, the discharge of the washing fluid is stopped after the predetermined period of time passes and the rotational speed of the wafer W is increased. This causes the washing fluid on the wafer W to be scattered and the wafer W to be dried. After the wafer W is dried for a predetermined period of time, the rotation of the wafer W is stopped.

Thereafter, the wafer W is hoisted again to the position above the upper end part of the cup 265 by the hoisting and lowering pins 263. The wafer W is then delivered to the main carrier 213 in the same way as when it is carried in to be carried outside the casing 218a and a series of the developing treatment is finished.

According to the above embodiment, the width of the opening 273 is adjusted by the hoisting and lowering mechanism 269 for vertically moving the cup side portion 266 and the flow rate of the air passing through the opening 273 is adjusted by exhausting the air from the exhaust port 272 which is inside the cup 265. Thereby, the flow rate of the air flowing into the cup 265 from the upper part and the flow rate of the air flowing out of the cup 265 are adjustable. This makes it possible to adjust the strength of the aforesaid air current according to each process in the developing treatment and prevent the impurities from adhering to the wafer W, and at the same time, to maintain the temperature inside the surface of the wafer W when necessary.

More specifically, the flow rate of the air flowing into the cup 265 is made higher than the flow rate of the air flowing out of the cup 265 in the process of supplying the developing solution to the wafer W so that a strong descending air current which flows toward the area under the wafer W is formed around the wafer W. Consequently, the mist of the developing solution occurring from the wafer W is discharged from the area under the wafer W and the mist can be prevented from adhering to the wafer W again.

In the process of performing the static development for the wafer W, the cup 265 is raised to cause the wafer W to be lower than the upper end part of the cup 265. Consequently, the flow rate of the air flowing into the cup 265 is adjusted to be lower than the flow rate of the air flowing out of the cup 265 so that the air current flowing around the wafer W is suppressed and fall in the temperature of the surface of the wafer W due to the air current is suppressed, and thereby, the temperature of the wafer W is maintained.

In the process of washing and drying the wafer W, the flow rate of the air flowing into the cup 265 is adjusted to be higher than the flow rate of the air flowing out of the cup 265 so that the mist of the washing fluid, the developing solution, and so on caused by the rotation of the wafer W is appropriately discharged from the area under the wafer W, which makes it possible to prevent the mist from adhering to the wafer W again, floating out of the cup 265, and contaminating the inside of the casing 218a.

The slanting collecting plate 275 is provided outside the cup 265 so that the developing solution and so on leaking out of the cup 265 can be appropriately collected, which makes it possible to realize recycling of the developing solution while preventing the contamination inside the casing 218a.

The height of the wafer W is made changeable according to each process of the developing treatment by the hoisting and lowering pins 263 which is capable of disposing the wafer W at a predetermined height so that the wafer W can be disposed in an appropriate position relative to the cup 265 for undergoing the developing treatment. Particularly, in the process of the static development for the wafer W, the wafer W is positioned lower than the upper end part of the cup 265, which makes it possible to prevent the air supplied from the air supply mechanism 280 from directly touching the wafer W and temperature distribution from being non-uniform over the surface of the wafer W.

According to the above embodiment, the cup side portion 265 is vertically moved to adjust the flow rate of the air, but the flow rate of the air flowing into the cup 265 and the flow rate of the air flowing out of the cup 265 may be adjusted in a manner in which an exhaust port for exhausting the atmosphere inside the cup 265 and an exhaust port for exhausting the atmosphere outside the cup 265 are separately provided and furthermore, a damper is provided in each of the exhaust ports to adjust the flow rate of the air exhausted from each of the exhaust ports.

According to the above embodiment, the hoisting and lowering pins 263 are used as a hoisting and lowering mechanism for enabling the wafer W to vertically move, but a drive mechanism for vertically moving the spin chuck 261 may be provided to vertically move the wafer W.

According to the above embodiment, the developing solution supply nozzle 285 is moved from one edge to the other edge of the wafer W to supply the developing solution onto the wafer W, but the developing solution may be supplied in a manner in which the developing solution supply nozzle 285 is disposed above the center of the wafer W and the developing solution supply nozzle 285 and the wafer W are rotated relative to each other. This is realized by having the spin chuck 261 hold the wafer W at the time of supplying the developing solution, in a case when the wafer W is to be rotated. Meanwhile, in a case when the developing solution supply nozzle 285 is to be rotated, this is realized by providing a rotation mechanism in the arm 291 which holds the developing solution supply nozzle 285 and rotating the developing solution supply nozzle 285 while the developing solution is being discharged.

Incidentally, the developing solution on the wafer W sometimes leaks to the rear surface from the circumferential edge of the wafer W when the developing solution is supplied onto the wafer W. In this case, the rear surface may possibly be contaminated and the developing treatment may not possibly be performed in a uniform manner since difference in temperature between the circumferential edge and the center part of the wafer W is caused due to this leakage.

Figure 26:
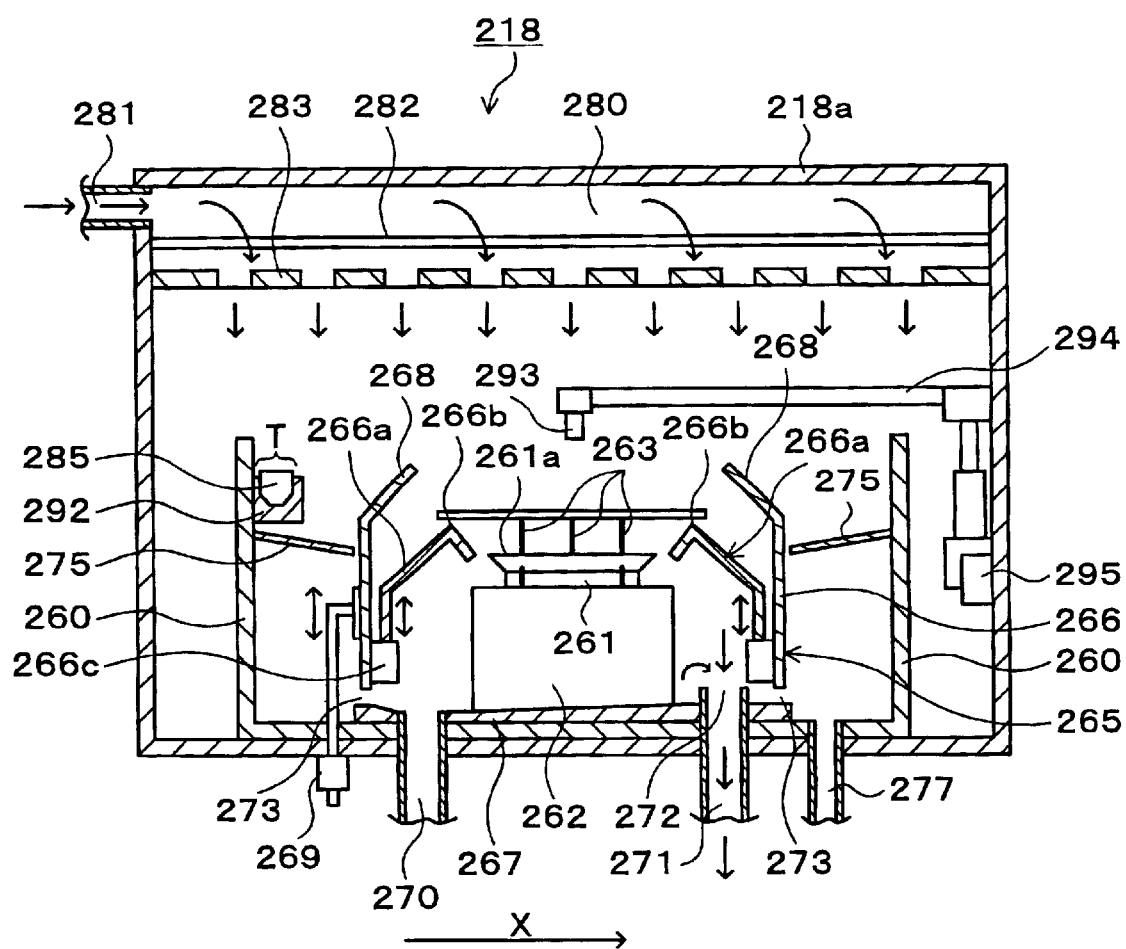
FIG. 26 is an explanatory view showing a state inside the developing unit having a member for preventing the developing solution from leaking.

In order to prevent this, a preventing member 266a which has a similar shape to that of the cup 266, for preventing the above leakage of the developing solution and so on is provided inside the cup 266, for example, according to an example shown in FIG. 26. This preventing member 266a has a substantially cylindrical shape and its upper part is bent inward to form a top portion 266b. The preventing member 266a itself is supported by a hoisting and lowering mechanism 266c which is provided on an inner wall of the cup 266 and composed of, for example, a cylinder, a motor, and so on. The drive of the hoisting and lowering mechanism 266c causes the preventing member 266a to vertically move independently of the cup 266. When it moves upward, the top portion 266b closely approaches the rear surface of the wafer W.

This preventing member 266a is used in the following manner. The preventing member 266a moves upward so that space between the top portion 266b and the rear surface of the wafer W becomes, for example, approximately 1 mm when the developing supply solution is to be supplied onto the wafer W with the hoisting and lowering pins 263 being raised and supporting the wafer W, for example, as in a state shown in FIG. 23. As a result, the developing solution supplied onto the wafer W is trapped at the top portion 266b even when it leaks toward the rear surface of the wafer W Therefore, the developing solution does not reach the rear surface of the wafer W.

The top portion 266b is ring-shaped when seen from above and appropriately, it has a size so as to get as close as possible to the edge of the wafer W. In other words, it is appropriate that the top portion 266b is positioned under the wafer W and as outward as possible.

The developing unit for the wafer W in the photolithography process of the semiconductor wafer device fabrication processes is explained in the embodiments described above, but the present invention is also applicable to developing units for substrates other than the semiconductor wafer, for example, an LCD substrate and is also applicable to other units for supplying various treatment solutions with low viscosity, for example, a resist solution, to a substrate surface to form a resist film.

According to the present invention, the air current flowing into and out of the vessel can be controlled so that the re-adhesion of the impurities to the substrate and the non-uniform temperature distribution over the substrate surface due to the air current can be prevented. This prevents low-quality developing, defective line width, and so on and realizes improvement in yielding. Since the air current is controlled not to touch the substrate in the developing process for the substrate, the developing process in which the non-uniform temperature distribution over the substrate surface has a great influence in causing the defective line width is appropriately performed.

The air current around the substrate is controlled to strengthen in a rotation process of the substrate so that the re-adhesion of the impurities to the substrate is prevented in the rotation process where the impurities easily occur from the substrate and the like.

What is claimed is:

1. A solution treatment unit for supplying a treatment solution to a substrate and treating the substrate inside an accommodating vessel, comprising:

a frame for having the accommodating vessel mounted therein, wherein the accommodating vessel is structured to be pulled out freely in a predetermined direction from said frame;

wherein a supply duct for supplying gas into the accommodating vessel therethrough is attached to said frame, wherein the supply duct is connected to a gas supply section for supplying the gas into the accommodating vessel, and wherein the gas supply section is attached to said frame.

2. A solution treatment unit according to claim 1, wherein the supply duct is attached to a side surface except on the predetermined direction side of said frame.

3. A solution treatment unit according to claim 2, wherein a plurality of the accommodating vessels are disposed in said frame in multi-tiers in a vertical direction, and wherein the supply ducts connected to the respective accommodating vessels are concentratedly disposed along a side surface of said frame in the vertical direction.

4. A solution treatment unit for supplying a treatment solution to a substrate and treating the substrate inside an accommodating vessel, comprising:

a frame for having the accommodating vessel mounted therein, wherein the accommodating vessel is structured to be pulled out freely in a predetermined direction from said frame; and further comprising:

an exhaust pipe which is connected to the accommodating vessel, for exhausting an atmosphere inside the accommodating vessel; and an exhaust duct for exhausting the atmosphere out of said frame, wherein a connecting end portion of said exhaust duct is detachably connected to a connecting end portion of said exhaust pipe.

5. A solution treatment unit according to claim 4, wherein the predetermined direction is a horizontal direction, wherein the connecting end portion of said exhaust duct is provided in a side part on a perpendicular direction side to the predetermined direction of said frame, wherein a part on a reverse direction side of the predetermined direction of the connecting end portion of said exhaust duct is formed to protrude toward the connecting end portion of said exhaust pipe, when seen from its plane surface, and wherein a part on the predetermined direction side of the connecting end portion of said exhaust pipe is formed to protrude toward the connecting end portion of said exhaust duct to conform with a shape of the connecting end portion of said exhaust duct, when seen from its plane surface.

6. A solution treatment unit according to claim 5, wherein the connecting end portion of said exhaust duct and the connecting end portion of said exhaust pipe are formed to be slanted when seen from their plane surfaces.

7. A solution treatment unit according to claim 4, wherein the predetermined direction is a horizontal direction, wherein the connecting end portion of said exhaust duct is provided in a side part on a perpendicular direction side to the predetermined direction of said frame, wherein the connecting end portion of said exhaust duct is an insertion port which opens toward the predetermined direction when seen from its plane surface, and wherein the connecting end portion of said exhaust pipe has a shape being allowed to be inserted into the insertion port of said exhaust duct and protruding in a reverse direction of the predetermined direction when seen from its plane surface.

8. A solution treatment unit according to claim 7, wherein the connecting end portion of said exhaust pipe has a tapered shape.

9. A solution treatment unit according to claim 7, wherein the insertion port has a sealing material for securing air-tightness on a surface of an inner wall thereof.

10. A solution treatment unit according to claim 7, wherein the insertion port has a sponge material on a surface of an inner wall thereof.

11. A solution treatment unit according to claim 4, wherein the accommodating vessels are disposed in said frame in multi-tiers in a vertical direction, and wherein the exhaust ducts connected to the respective exhaust pipes of the accommodating vessels are concentratedly disposed along a side surface except on the predetermined direction side of said frame in a vertical direction.

12. A solution treatment unit for supplying a treatment solution to a substrate and treating the substrate inside an accommodating vessel, comprising:

a frame for having the accommodating vessel mounted therein, wherein the accommodating vessel is structured to be pulled out freely in a predetermined direction from said frame; and wherein a hoisting and lowering pin for hoisting and lowering the substrate is provided inside the accommodating vessel.

13. A solution treatment unit for supplying a treatment solution to a substrate and treating the substrate inside an accommodating vessel, comprising:

a frame for having the accommodating vessel mounted therein, wherein the accommodating vessel is structured to be pulled out freely in a predetermined direction from said frame; and further comprising:

a processing vessel disposed inside the accommodating vessel to enclose an outer circumference of the substrate; and a hoisting and lowering mechanism for hoisting and lowering said processing vessel.

14. A solution treatment unit for supplying a treatment solution to a substrate and treating the substrate inside an accommodating vessel, comprising:

a frame for having the accommodating vessel mounted therein, wherein the accommodating vessel is structured to be pulled out freely in a predetermined direction from said frame;

wherein the treatment solution is a developing solution used for performing developing treatment for the substrate, and the solution treatment unit further comprising:

a plurality of developing solution supply nozzles for supplying the developing solution to the substrate; and washing tanks for washing said developing solution supply nozzles, wherein the accommodating vessel is formed in a square shape when seen from its plane surface, wherein said plural developing supply nozzles are movable on a same rail extending in a first direction along the square shape of the accommodating vessel, and wherein said washing tanks are provided on both side walls on the first direction side of the accommodating vessel.

15. A solution treatment unit according to claim 14, wherein the first direction is a direction perpendicular to the predetermined direction.

16. A solution treatment unit according to claim 14, further comprising:

a washing fluid supply unit for supplying a washing fluid to the substrate, wherein said washing fluid supply unit is movable in another direction which is perpendicular to the first direction.

17. A solution treatment method for supplying a treatment solution to a substrate and performing solution treatment for the substrate inside a vessel disposed in a casing, comprising the steps of:

supplying gas from an upper part of the vessel inside the casing;

adjusting a first flow rate of the supplied gas flowing into the vessel and a second flow rate of the supplied gas flowing out of the vessel; and exhausting the gas flowing into the vessel and the gas flowing out of the vessel outside the casing;

wherein the first flow rate is adjusted to be lower than the second flow rate while the treatment solution is supplied onto the substrate and the substrate is treated.

18. A solution treatment method according to claim 17, wherein the substrate is positioned lower than an upper end part of the vessel when the substrate is treated.

19. A solution treatment method according to claim 17, wherein the first flow rate is adjusted to be higher than the second flow rate when the substrate is rotated after the solution treatment for the substrate is finished.

20. A solution treatment method according to claim 17, wherein the first flow rate is adjusted to be higher than the second flow rate when the treatment solution is supplied onto the substrate.

21. A solution treatment method according to claim 17, wherein the first flow rate and the second flow rate are adjusted by vertical movement of the vessel.

22. A solution treatment unit for performing solution treatment for a substrate inside a casing, comprising:

a vessel provided inside the casing to enclose an outer circumference of the substrate;

a gas supply section for supplying gas into the casing;

an exhaust section for collectively exhausting an atmosphere flowing into said vessel and an atmosphere flowing out of said vessel outside the casing; and an adjusting unit for adjusting a flow rate of gas flowing into said vessel and a flow rate of gas flowing out of said vessel;

wherein an exhaust port of said exhaust section is provided inside said vessel, wherein said vessel is provided with a flow-in port for allowing the gas flowing out of said vessel to flow into said vessel, and wherein said adjusting unit is a vessel drive unit for enabling an opening/closing degree of the flow-in port to be adjusted by vertically moving said vessel.

23. A solution treatment unit for performing solution treatment for a substrate inside a casing, comprising:

a vessel provided inside the casing to enclose an outer circumference of the substrate;

a gas supply section for supplying gas into the casing;

an exhaust section for collectively exhausting an atmosphere flowing into said vessel and an atmosphere flowing out of said vessel outside the casing; and an adjusting unit for adjusting a flow rate of gas flowing into said vessel and a flow rate of gas flowing out of said vessel;

wherein a collecting plate for collecting a developing solution leaking out of said vessel is provided outside an outer circumference of said vessel, and wherein the collecting plate is provided with a plurality of ventilation holes through which the gas flowing out of said vessel flows.

24. A solution treatment unit according to claim 23, wherein the collecting plate is inclined to become lower toward said vessel.

25. A solution treatment unit for performing solution treatment for a substrate inside a casing, comprising:

a vessel provided inside the casing to enclose an outer circumference of the substrate;

a gas supply section for supplying gas into the casing;

an exhaust section for collectively exhausting an atmosphere flowing into said vessel and an atmosphere flowing out of said vessel outside the casing;

an adjusting unit for adjusting a flow rate of gas flowing into said vessel and a flow rate of gas flowing out of said vessel; and a hoisting and lowering mechanism for vertically moving the substrate.

26. A solution treatment unit according to claim 25, wherein a preventing member for trapping a treatment solution leaking toward a rear surface of the substrate via a circumferential edge part of the substrate from a substrate surface is provided inside said vessel, approaching the rear surface of the substrate which is hoisted by said hoisting and lowering mechanism.

* * * * *